US009472718B2

(12) United States Patent
Hodota

(10) Patent No.: US 9,472,718 B2
(45) Date of Patent: Oct. 18, 2016

(54) SEMICONDUCTOR LIGHT-EMITTING ELEMENT COMPRISING AN INSULATING REFLECTION LAYER INCLUDING PLURAL OPENING PORTIONS

(71) Applicant: Takashi Hodota, Ichihara (JP)

(72) Inventor: Takashi Hodota, Ichihara (JP)

(73) Assignee: TOYODA GOSEI CO., LTD., Aichi (JP)

(*) Notice: Subject to any disclaimer, the term of this patent is extended or adjusted under 35 U.S.C. 154(b) by 22 days.

(21) Appl. No.: 13/871,649

(22) Filed: Apr. 26, 2013

(65) Prior Publication Data
US 2013/0285099 A1 Oct. 31, 2013

(30) Foreign Application Priority Data

Apr. 27, 2012 (JP) ................................. 2012-104044

(51) Int. Cl.
H01L 29/205 (2006.01)
H01L 33/00 (2010.01)
H01L 33/10 (2010.01)
H01L 33/40 (2010.01)
H01L 33/42 (2010.01)
H01L 33/46 (2010.01)

(52) U.S. Cl.
CPC ............. H01L 33/10 (2013.01); H01L 33/405 (2013.01); H01L 33/42 (2013.01); H01L 33/46 (2013.01)

(58) Field of Classification Search
CPC ....... H01L 33/60; H01L 33/20; H01L 33/62; H01L 33/32; H01L 33/38
USPC .............................................. 257/98, 79, 91
See application file for complete search history.

(56) References Cited

U.S. PATENT DOCUMENTS

| 2003/0160259 | A1* | 8/2003 | Uemura ........................... 257/99 |
| 2006/0273335 | A1 | 12/2006 | Asahara et al. |
| 2008/0308829 | A1* | 12/2008 | Liu .......................... H01L 33/38 257/98 |
| 2009/0294784 | A1* | 12/2009 | Nakahara et al. ............... 257/98 |
| 2010/0012920 | A1* | 1/2010 | Park .......................... H01L 33/14 257/13 |
| 2010/0032689 | A1* | 2/2010 | Park ......................... H01L 33/14 257/87 |
| 2010/0096651 | A1* | 4/2010 | Kim ....................... H01L 33/382 257/94 |

(Continued)

FOREIGN PATENT DOCUMENTS

| JP | 2007-158129 A | 6/2007 |
| JP | 2009-164423 A | 7/2009 |

(Continued)

Primary Examiner — Lex Malsawma
Assistant Examiner — Eric Jones
(74) Attorney, Agent, or Firm — Sughrue Mion, PLLC

(57) ABSTRACT

A semiconductor light-emitting element includes: a laminated semiconductor layer in which an n-type semiconductor layer, a light-emitting layer and a p-type semiconductor layer are laminated; a transparent conductive layer laminated on the p-type semiconductor layer of the laminated semiconductor layer and composed of a metal oxide having optical transparency to light emitted from the light-emitting layer; an insulating reflation layer laminated on the transparent conductive layer in which plural opening portions are provided to expose part of the transparent conductive layer; a metal reflection layer formed on the insulating reflection layer and inside the opening portions and composed of a metal containing aluminum; and a metal contact layer provided between the part of the transparent conductive layer exposed at the opening portion and the part of the metal reflection layer formed inside the opening portion, which contains an element selected from Group VIA and Group VIII of a periodic table.

5 Claims, 12 Drawing Sheets

(56) References Cited

U.S. PATENT DOCUMENTS

| | | |
|---|---|---|
| 2010/0208763 A1 | 8/2010 | Engl et al. |
| 2010/0264416 A1* | 10/2010 | Tamura ............. H01L 29/78696 257/57 |
| 2011/0017976 A1* | 1/2011 | Khan ..................... B82Y 20/00 257/13 |
| 2011/0089401 A1* | 4/2011 | Hiraiwa ................. H01L 33/38 257/13 |
| 2011/0198641 A1* | 8/2011 | Yahata ................... H01L 33/46 257/98 |
| 2011/0241037 A1* | 10/2011 | Park ................... H01L 25/0756 257/89 |
| 2011/0255294 A1* | 10/2011 | Okabe et al. ................. 362/362 |
| 2011/0316039 A1* | 12/2011 | Liu ........................ H01L 33/38 257/99 |
| 2012/0012889 A1 | 1/2012 | Okabe et al. |
| 2012/0025244 A1* | 2/2012 | Suh et al. ....................... 257/98 |
| 2012/0146083 A1* | 6/2012 | Liu ........................ H01L 33/38 257/98 |
| 2013/0049053 A1 | 2/2013 | Kususe et al. |

FOREIGN PATENT DOCUMENTS

| | | |
|---|---|---|
| JP | 2010-263016 A | 11/2010 |
| JP | 2014-44971 A | 3/2014 |
| WO | 2006/006555 A1 | 1/2006 |

\* cited by examiner

SEMICONDUCTOR LIGHT-EMITTING ELEMENT COMPRISING AN INSULATING REFLECTION LAYER INCLUDING PLURAL OPENING PORTIONS

CROSS REFERENCE TO RELATED APPLICATIONS

This application is based on and claims priority under 35 USC §119 from Japanese Patent Application No. 2012-104044 filed Apr. 27, 2012.

BACKGROUND

1. Technical Field

The present invention relates to a semiconductor light-emitting element.

2. Related Art

In recent years, a flip-chip bonding (FC) mount technology has been developed, in which a semiconductor light-emitting element formed on a substrate that is transparent to light emission wavelength is reversed and mounted on a circuit board (submount) or a package. The flip-chip bonding is a mounting method that extracts light mainly from a surface on a growing substrate side that is opposite to an electrode forming surface, and is also referred to as a face-down mounting. For example, in Japanese Patent Application Laid-Open Publication No. 2010-263016, there is disclosed a semiconductor light-emitting element that includes a substrate made of sapphire, and a laminated semiconductor layer including an n-type semiconductor layer, a light-emitting layer and a p-type semiconductor layer to be laminated on the substrate, and is mounted by flip-chip bonding.

Incidentally, the semiconductor light emitting element mounted by flip-chip bonding is required to have a high reflectance for outputting light from the light-emitting layer in the direction of the substrate side to improve brightness. As a metal having high reflectivity, silver (Ag) is used.

However, silver (Ag) has high migration properties compared to other elements, and therefore, for example, defects due to a GaN potential is affected and a leakage current occurs in some cases. In addition, for preventing the migration phenomenon, for example, a method of providing a barrier layer to a metal reflection film containing silver (Ag) or the like can be considered; however, a problem of complicating manufacturing processes or the like is further generated.

An object of the present invention is to improve reliability of a metal reflection film in the FC (flip-chip bonding) mounting technology for a semiconductor light-emitting element.

SUMMARY

According to the present invention, there is provided a semiconductor light-emitting element including: a laminated semiconductor layer in which an n-type semiconductor layer, a light-emitting layer and a p-type semiconductor layer are laminated; a transparent conductive layer that is laminated on the p-type semiconductor layer of the laminated semiconductor layer and is composed of a metal oxide having optical transparency to light emitted from the light-emitting layer; an insulating reflection layer that is laminated on the transparent conductive layer, in which plural opening portions are provided to expose part of the transparent conductive layer; a metal reflection layer that is formed on the insulating reflection layer and inside the opening portions of the insulating reflection layer, and is composed of a metal containing aluminum; and a metal contact layer that is formed at least between the part of the transparent conductive layer exposed at the opening portion and part of the metal reflection layer formed inside the opening portion, and contains an element selected from Group VIA and Group VIII of a periodic table.

Here, it is preferable that the metal contact layer at least contains an element selected from chromium, molybdenum and nickel.

Moreover, it is preferable to include a first metal layer containing aluminum or an aluminum-neodymium alloy and a second metal layer containing tantalum or nickel between the metal contact layer and the metal reflection layer.

Further, it is preferable that the metal reflection layer contains aluminum or an aluminum-neodymium alloy.

Still further, it is preferable that the insulating reflection layer is made of a multilayer insulating layer configured by alternately laminating a first insulating layer having a first refractive index and optical transparency to the light emitted from the light-emitting layer and a second insulating layer having a second refractive index, which is higher than the first refractive index, and optical transparency to the light emitted from the light-emitting layer.

According to the present invention, reliability of a metal reflection film is improved in the FC (flip-chip bonding) mounting technology for a semiconductor light-emitting element.

Moreover, in comparison with a case where a metal contact layer containing an element selected from Group VIA and Group VIII of the periodic table is not provided between a metal reflection layer containing aluminum and a transparent conductive layer, oxidation of the metal reflection layer is suppressed, and thereby increase of a forward voltage (Vf) is suppressed.

BRIEF DESCRIPTION OF THE DRAWINGS

Exemplary embodiments of the present invention will be described in detail based on the following figures, wherein.

DETAILED DESCRIPTION

Hereinafter, exemplary embodiments according to the present invention will be described in detail. It should be noted that the present invention is not limited to the following exemplary embodiments, but may be practiced as various modifications within the scope of the gist of the invention. In other words, unless otherwise specified, dimensions, materials, shapes or relative arrangement of components described in the specific examples of the exemplary embodiments do not purport to limit the scope of the present invention, but are merely descriptive examples. Further, each of the figures to be used indicates a specific example for illustration of each exemplary embodiment, and does not represent an actual size thereof. Moreover, in this specification, a phrase such as "the layer A formed above (over) the layer B" not only means the case where the layer A is formed above (over) the layer B with a separation therebetween, but also includes the case where the layer A is formed above (over) the layer B with some layer being interposed therebetween.

(First Exemplary Embodiment)
<Semiconductor Light-Emitting Element 10>

Figure 1:
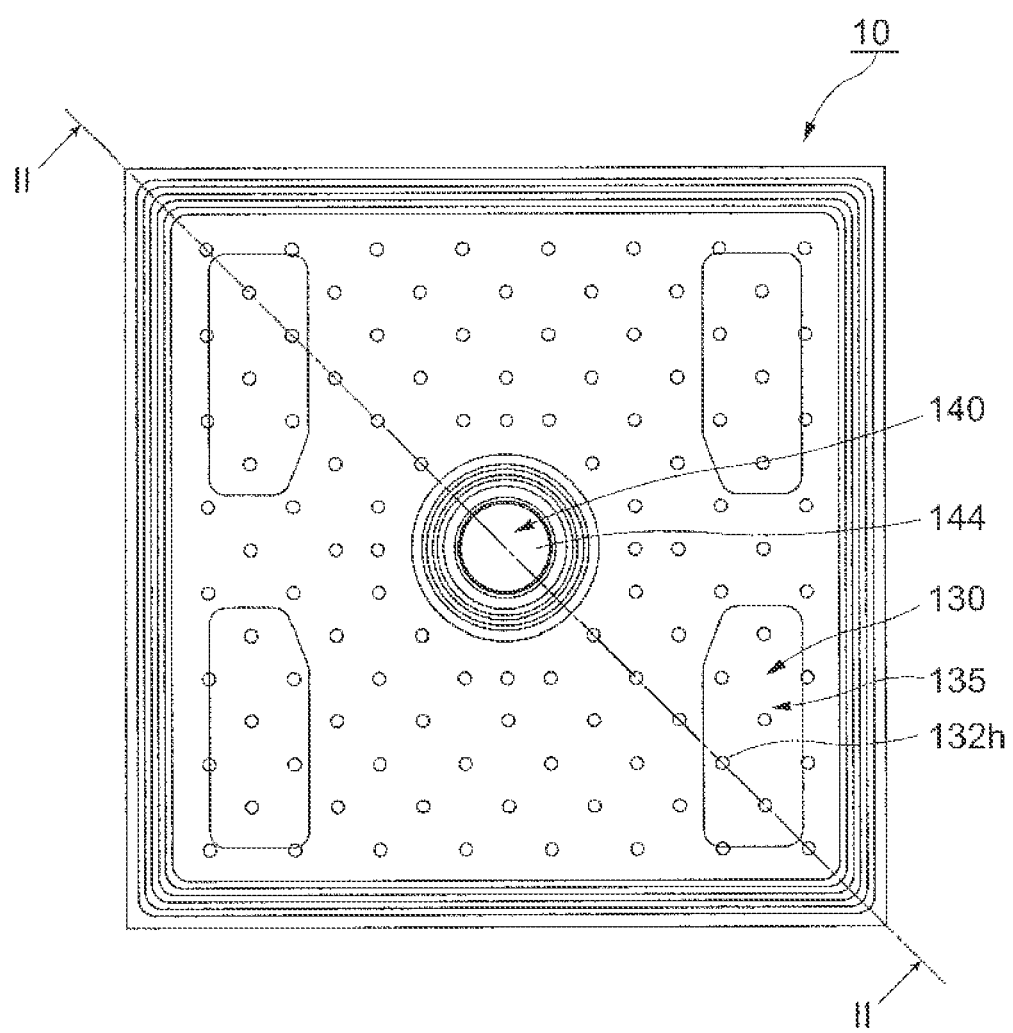
FIG. 1 is a plan schematic view illustrating a first exemplary embodiment, which is a specific example of a semiconductor light-emitting element.

FIG. 1 is a plan schematic view illustrating a first exemplary embodiment, which is a specific example of a semiconductor light-emitting element.

The semiconductor light-emitting element 10 shown in FIG. 1 has a square planar shape, on a center portion of which an n-electrode layer 140 as a negative electrode is formed. In the n-electrode layer 140, part of an n-electrode bonding layer 144 used for electrical connection with an outside is exposed. A p-electrode layer 130 as a positive electrode is formed to cover substantially an entire top surface of a semiconductor layer 120, which will be described later (refer to FIG. 2), except for a portion where a part of the semiconductor layer 120 is removed by etching or the like for forming the n-electrode layer 140. In the p-electrode layer 130, at each of four portions that are close to four corners of the semiconductor light-emitting element 10, part of a p-electrode bonding layer 135 used for electrical connection with an outside is exposed.

As will be described later, in an insulating reflection layer 132 (refer to FIG. 2) of the p-electrode layer 130, plural opening portions 132h are formed. The opening portion 132h is indicated as a circular blank portion (diameter is 8 μm). In FIG. 1, a pattern is shown in which the plural opening portions 132h are arranged with intervals (pitch 1) in the entire insulating reflection layer 132 (refer to FIG. 2) (referred to as "isolation pattern").

Next, description will be given of a cross-sectional structure of the semiconductor light-emitting element 10.

Figure 2:
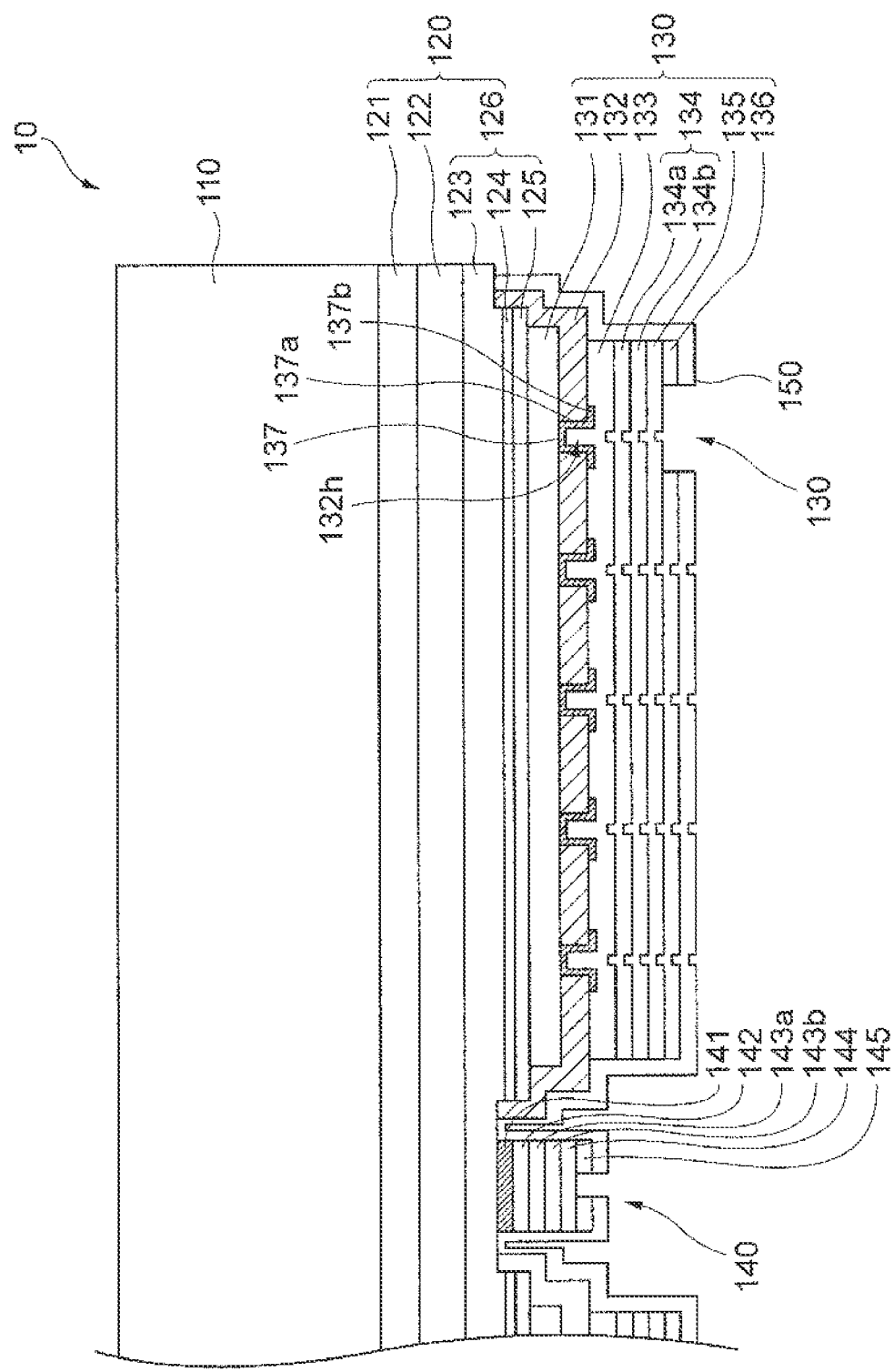
FIG. 2 is an II-II cross-sectional schematic view showing the semiconductor light-emitting element shown in FIG. 1.

FIG. 2 is an II-II cross-sectional schematic view showing the semiconductor light-emitting element 10 shown in FIG. 1. Here, the semiconductor light-emitting element 10 is rendered in a state where the semiconductor light-emitting element 10 is reversed to be subjected to flip-chip mounting in which the substrate 110 faces upwardly. In the following description, expression such as "on (above or over) the layer" means that each layer is laminated downwardly in the figure.

As shown in FIG. 2, the semiconductor light-emitting element 10 includes the substrate 110, the semiconductor layer 120 laminated on the substrate 110, and the p-electrode layer 130 as the positive electrode and the n-electrode layer 140 as the negative electrode formed on the semiconductor layer 120.

The semiconductor layer 120 includes an intermediate layer (buffer layer) 121 formed on the substrate 110 and a base layer 122 laminated on the intermediate layer 121. The semiconductor layer 120 also includes a laminated semiconductor layer 126 laminated on the base layer 122. The laminated semiconductor layer 126 is configured with, from the base layer 122 side, an n-type semiconductor layer 123, a light-emitting layer 124 and a p-type semiconductor layer 125.

The p-electrode layer 130 is formed on a top surface of the p-type semiconductor layer 125. The n-electrode layer 140 is formed on an exposed surface in which part of the n-type semiconductor layer 123 is exposed. Moreover, the p-electrode layer 130 and the n-electrode layer 140 include portions to expose surfaces thereof facing downward in FIG. 2 for electrical connection with an outside through plated bumps 24 and 25 (refer to FIG. 11) to be described later, respectively.

It should be noted that, in the exemplary embodiment, surfaces of the n-electrode layer 140 and the p-electrode layer 130 are covered with a protecting layer 150 except for some parts. The protecting layer 150 is formed to cover part of side wall surfaces of the p-type semiconductor layer 125, the light-emitting layer 124 and the n-type semiconductor layer 123.

(P-Electrode Layer 130)

In the exemplary embodiment, the p-electrode layer 130 is configured by laminating: a transparent conductive layer 131 composed of a metal oxide; the insulating reflection layer 132; a metal contact layer 137 to be described later, which is formed inside the opening portion 132h of the insulating reflection layer 132; a metal reflection layer 133 composed of a metal containing aluminum; a p-electrode diffusion-preventing layer 134 (a first p-electrode diffusion-preventing layer 134a and a second p-electrode diffusion-preventing layer 134b); the p-electrode bonding layer 135 and a p-electrode adhesive layer 136 in order from the p-type semiconductor layer 125 side.

(Transparent Conductive Layer 131)

As a material for constituting the transparent conductive layer 131, a conductive metal oxide material that transmits at least 80% of the order of light of wavelength emitted from the light-emitting layer 124 is used. For example, oxides containing In (indium) are provided. Specific examples include: ITO (indium tin oxide ($In_2O_3$—$SnO_2$)); IZO (indium zinc oxide ($In_2O_3$—ZnO)); IGO (indium gallium oxide ($In_2O_3$—$Ga_2O_3$)); and ICO (indium cerium oxide ($In_2O_3$—$CeO_2$)). Of these, in particular, a transparent material containing $In_2O_3$ crystals having a crystal structure of a hexagonal system or a bixbyite structure (for example, ITO or IZO) is preferable. Further, in the case where IZO containing $In_2O_3$ crystals having a crystal structure of a hexagonal system is used, an amorphous IZO film that has an excellent etching property can be used and processed into a specific shape, and thereafter, by transferring the amorphous state into a structure containing crystals through a heat treatment or the like, processed into an electrode that is more excellent in optical transparency than the amorphous IZO film.

In the exemplary embodiment, the thickness of the transparent conductive layer 131 is selected from a range of 10 nm to 300 nm. Or, the thickness is preferably selected from a range of 50 nm to 250 nm. In the case where the transparent conductive layer 131 is excessively thin or thick, there is an unfavorable tendency in terms of light transparency to the light emitted from the light-emitting layer 124 and the reflected light from the metal reflection layer 133.

The sheet resistance of the transparent conductive layer 131 is, though depending upon the manufacturing method thereof, infinite when the thickness is 10 nm, 250 per square when the thickness is 20 nm, 175 per square when the thickness is 25 nm, 72 per square when the thickness is 50 nm, 29 per square when the thickness is 100 nm, and 15 per square when the thickness is 200 nm.

(Insulating Reflection Layer 132)

The insulating reflection layer 132 is laminated on the transparent conductive layer 131, and in combination with the metal reflection layer 133, has a function of a reflection film that reflects light outputted from the light-emitting layer 124. As a layer structure of the insulating reflection layer 132, a single-layer structure or a multilayer structure is used. The insulating reflection layer 132 having a multilayer structure has a high degree of flexibility in the design for controlling reflectance properties compared to the insulating reflection layer having a single-layer structure, and accordingly, the insulating reflection layer 132 having a multilayer structure is more preferable.

In the case where the insulating reflection layer 132 has a single-layer structure, the insulating reflection layer 132 is configured with a material having transparency of at least of the order of 90% and preferably 95% or more to the light outputted from the light-emitting layer 124, a refractive index lower than that of the transparent conductive layer 131, and insulating properties. Specific examples of materials constituting the insulating reflection layer 132 include: $SiO_2$ (silicon dioxide); $MgF_2$ (magnesium fluoride); $CaF_2$ (calcium fluoride); and $Al_2O_3$ (aluminum oxide). In the exemplary embodiment, as the insulating reflection layer 132, $SiO_2$ (silicon dioxide) having a refractive index of 1.48 (wavelength of 450 nm) is used. It should be noted that the refractive index of an IZO film constituting the transparent conductive layer 131 is 2.14 (wavelength of 450 nm).

In the exemplary embodiment, the thickness (H) of the insulating reflection layer 132 is, in a relation with $Q=(\lambda/4n)$ defined by use of the refractive index n of the insulating reflection layer 132 and the wavelength $\lambda$ (nm) of the light-emitting layer 124, set in a relation of formula (1) as shown below. As described above, Q indicates a result of dividing the wavelength $\lambda$ (nm) of the light-emitting layer 124 by a four-fold refractive index n.

$$H=AQ \quad (1)$$

Further, it is preferable to set the thickness of the insulating reflection layer 132 based on the following formula (2). In other words, it is preferable to set the thickness to 5Q (A=5) or more. It is more preferable to set the thickness in a range larger than 5Q (A=5). However, under the constraint of production costs, the thickness is preferably 20Q (A=20) or less.

$$H \geq 5Q \quad (2)$$

In the exemplary embodiment, it is preferable to set the thickness of the insulating reflection layer 132 in the range that A exceeds 5, namely, in the case of blue light of the wavelength of 450 nm, in the range of the thickness exceeding 380 nm. From experimental data of the inventors and simulation results, a conclusion that the light emission intensity is particularly increased with a thickness in which A is an odd number, such as A=3, 5, 7, . . . is obtained, and a fact that the thickness in which A=3, 5, 7 and so forth is especially preferred and the output of the semiconductor light-emitting element 10 depends upon the thickness of the insulating reflection layer 132 is ascertained. In the exemplary embodiment, it is especially preferable that the thickness of the insulating reflection layer 132 is in a range that A is an odd number such as 3, 5, 7, . . . ±0.5 as a unit. More specifically, from the inventors' experiments, it is ascertained that the output of the semiconductor light-emitting element 10 is increased as A is increased (the thickness of the insulating reflection layer 132 is increased), and further, the light emission intensity is especially and effectively increased with the thickness in which A=3, 5, 7 . . . .

Next, description will be given of an insulating reflection layer having a multilayer structure, which is a specific example of another layer structure.

Figure 3:
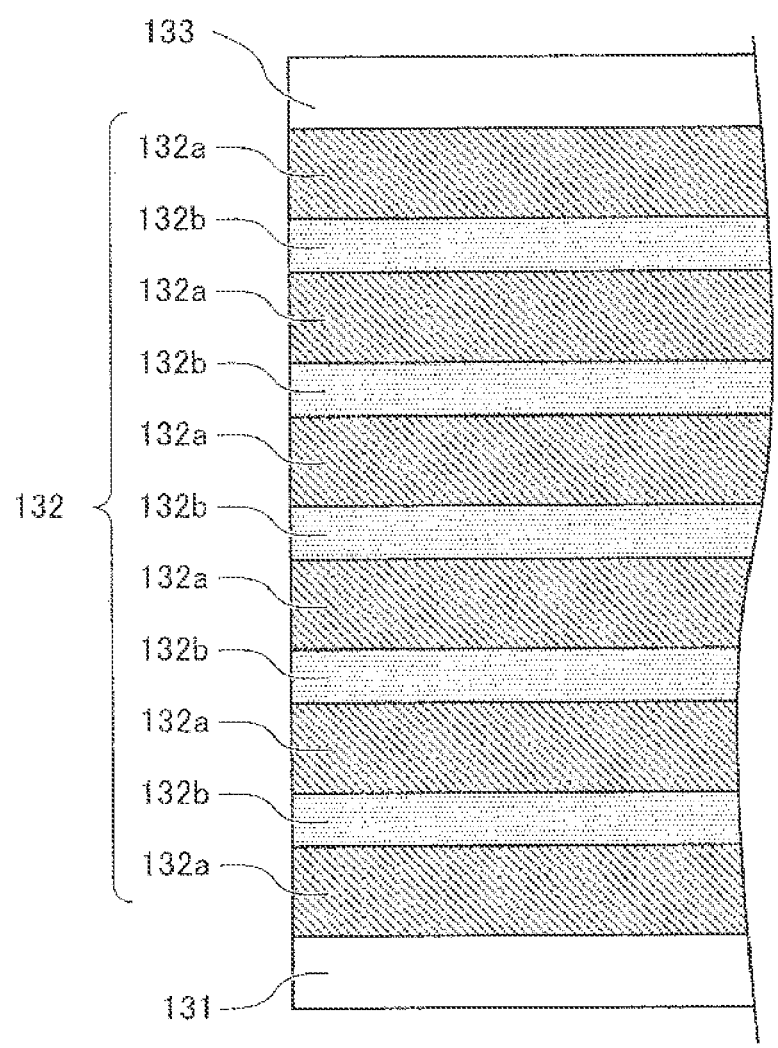
FIG. 3 is a cross-sectional schematic view illustrating a specific example of a layer structure of an insulating reflection layer.

FIG. 3 is a cross-sectional schematic view illustrating the specific example of a layer structure of the insulating reflection layer 132. In the exemplary embodiment, the insulating reflection layer 132 has a multilayer structure that is a laminated body of plural layers different in refractive index. The insulating reflection layer 132 having a multilayer structure is configured by alternately laminating first insulating reflection layers 132a having a first refractive index and second insulating reflection layers 132b having a second refractive index that is higher than the first refractive index. Especially, the exemplary embodiment employs a configuration in which one second insulating reflection layer 132b is sandwiched by two first insulating reflection layers 132a.

In the specific example shown in FIG. 3, five second insulating reflection layers 132b are sandwiched between six first insulating reflection layers 132a to provide eleven layers of laminated layer structure in total.

As the first insulating reflection layer 132a and the second insulating reflection layer 132b, a material having high optical transparent properties to the light emitted from the light-emitting layer 124 is used. Here, as the first insulating reflection layer 132a, for example, $SiO_2$ (silicon oxide) or $MgF_2$ (magnesium fluoride) can be used, and as the second insulating reflection layer 132b, $TiO_2$ (titanium oxide), $Ta_2O_5$ (tantalum oxide), $ZrO_2$ (zirconium oxide), $HfO_2$ (hafnium oxide) or $Nb_2O_5$ (niobium oxide) can be used. However, as long as relation in the refractive index with the second insulating reflection layer 132b is satisfied, these $TiO_2$, $Ta_2O_5$, $ZrO_2$, $HfO_2$ or $Nb_2O_5$ may be used as the first insulating reflection layer 132a.

In the exemplary embodiment, $SiO_2$ (silicon oxide) is used as the first insulating reflection layer 132a, and $Ta_2O_5$ (tantalum oxide) having a refractive index of 2.21 (to light having wavelength of 450 nm) is used as the second insulating reflection layer 132b. These have high optical transparency to the light from the light-emitting layer 124 with light emission wavelength $\lambda$ (=400 nm to 450 nm).

Further, when it is assumed that the light emission wavelength of the light-emitting layer 124 is $\lambda$ (nm), the refractive index of the first insulating reflection layer 132a with respect to the light emission wavelength $\lambda$ is $n_L$ and the refractive index of the second insulating reflection layer 132b with respect to the light emission wavelength $\lambda$ is $n_H$, the thickness $d_L$ of each first insulating reflection layer 132a and the thickness $d_H$ of each second insulating reflection layer 132*b* are set based on the expressions shown as follows. In the exemplary embodiment, the thickness (H) of the insulating reflection layer 132 having a multilayer structure is 1000 nm to 1500 nm. R(1) and R(2) are positive real numbers.

[Expression 1]

$$d_L = \frac{\lambda}{4 \times n_L} \times R \quad (1)$$

$$d_H = \frac{\lambda}{4 \times n_H} \times R \quad (2)$$

(Opening Portion 132*h*)

In the insulating reflection layer 132, the plural opening portions 132*h* are provided to expose part of the transparent conductive layer 131. The opening portions 132*h* are formed to penetrate through the insulating reflection layer 132, and inside of each opening portion 132*h*, part of the metal reflection layer 133 is formed.

The diameter of the opening portion 132*h* is, in the exemplary embodiment, selected from a range of 5 μm to 30 μm, and preferably selected from a range of 5 μm to 20 μm. In FIGS. 1 and 2, the diameter of the opening portion 132*h* is 8 μm. The opening portion 132*h* is formed, for example, by a dry etching method, a lift-off method or the like in the insulating reflection layer 132 formed in advance.

The shape of the opening portion 132*h* in a planar view is not particularly limited, and the shape may be circular, oval, triangular, square, rectangular, trapezoidal, pentagonal or other polygonal one (including star shape), wedge shape or the like. The area of the opening portion 132*h* is not particularly limited, and further, the areas of respective plural opening portions 132*h* are same or different.

The plural opening portions 132*h* are provided at predetermined intervals (pitch 1). In the exemplary embodiment, pitch 1 is selected from a range of 10 μm to 120 μm. Further, preferably, pitch 1 is selected from a range of 20 μm to 100 μm. In FIGS. 1 and 2, pitch 1 is 40 μm.

The ratio of the sum total of the area of the plural opening portions 132*h* to the entire area of the insulating reflection layer 132 (area occupancy rate) is selected from a range of 2% to 50%. Moreover, the area occupancy rate is preferably selected from a range of 2% to 7%. In FIGS. 1 and 2, the area occupancy rate is 5%.

In the exemplary embodiment, the plural opening portions 132*h* are formed in the insulating reflection layer 132 and part of the metal reflection layer 133 and a conductive body portion including a metal contact layer 137 to be described later are formed in each opening portion 132*h*, to thereby uniformly pass a current over the entire surface of the p-type semiconductor layer 125 on the surface of the p-electrode layer 130 through the transparent conductive layer 131. This makes it possible to reduce light emission unevenness in the light-emitting layer 124.

(Metal Contact Layer 137)

In the opening portion 132*h*, the metal contact layer 137 is formed at least between a portion of the transparent conductive layer 131 exposed at the opening portion 132*h* and a portion of the metal reflection layer 133 formed in the opening portion 132*h*.

In the exemplary embodiment, in the metal contact layer 137, a side surface portion 137*a* thereof formed on a side surface inside the opening portion 132*h* of the insulating reflection layer 132 and a peripheral portion 137*b* formed around the periphery of the opening portion 132*h*, which is on a surface of the insulating reflection layer 132 on the metal reflection layer 133 side, are integrally formed.

The metal contact layer 137 contains an element selected from Group VIA and Group VIII of the periodic table. Specific examples of the elements selected from Group VIA of the periodic table include chromium (Cr) and molybdenum (Mo). A specific example of the element selected from Group VIII of the periodic table is nickel (Ni). Of these, nickel (Ni) is preferable in the exemplary embodiment. By part of the metal reflection layer 133 formed inside the opening portion 132*h* and the metal contact layer 137, the transparent conductive layer 131 and the metal reflection layer 133 laminated on the insulating reflection layer 132 have electrical conduction.

In the exemplary embodiment, the thickness of the metal contact layer 137 is selected from a range of 1 nm to 5 nm, and the metal contact layer 137 is preferably formed with a thickness of 3 nm or less, and especially preferably formed with a thickness of 2 nm or less.

It should be noted that the width of the peripheral portion 137*b* that is formed integrally with the metal contact layer 137 is 3 μm in the exemplary embodiment.

A method of forming the metal contact layer 137 with nickel (Ni) is performed according to, for example, the following procedures. A continuous insulating reflection layer 132 is formed on the transparent conductive layer 131, then, plural opening portions 132*h* that penetrate through the insulating reflection layer 132 are formed, and thereafter, an Ni (nickel) metal layer with a thickness of the order of 2 nm is formed by a sputtering method on the insulating reflection layer 132 in which the opening portions 132*h* have been formed. At this time, the Ni (nickel) metal layer is also formed inside the opening portion 132*h* to form the metal contact layer 137 at a portion in contact with the transparent conductive layer 131. Thereafter, the Ni (nickel) metal layer formed on the insulating reflection layer 132 is removed except for the peripheral part of the opening portion 132*h* (peripheral portion 137*b*).

In the exemplary embodiment, as the conditions for the sputtering method for forming the Ni (nickel) metal layer, a layer-forming temperature is set to the room temperature and the gas pressure is set to a pressure of the order of 3 Pa, which is higher than a gas pressure in a normal sputtering method. It is considered that, in the case of a thin film having a thickness of the order of 2 nm (5 nm or less), the metal contact layer 137 formed by the sputtering method under the conditions of low temperature and high pressure has an island film structure.

On the metal contact layer 137 having this kind of a film structure, further, the metal reflection layer 133 made of AlNd or the like, which will be described later, is formed.

As described above, by forming the Ni (nickel) metal layer at a part of the opening portion 132*h* of the insulating reflection layer 132, where the transparent conductive layer 131 is exposed, before the metal reflection layer 133 made of AlNd or the like is formed, it is possible to prevent oxidation in which AlNd removes O (oxygen) from an oxide containing In (indium) (for example, IZO or the like) constituting the transparent conductive layer 131, and resistance increases and Vf increases due to the oxidation. Moreover, in comparison with a case where the Ni (nickel) metal layer is formed on an entire surface of the transparent conductive layer 131 or an entire surface of the insulating reflection layer 132 in addition to the part of the opening portion 132h of the insulating reflection layer 132, where the transparent conductive layer 131 is exposed, the reflectance is improved.

By providing the metal contact layer 137, full contact between the transparent conductive layer 131 composed of a metal oxide and the metal reflection layer 133 composed of a metal containing aluminum is prevented. Consequently, oxidation of aluminum contained in the metal reflection layer 133 is prevented, and accordingly, increases in contact resistance or rise in the forward voltage (Vf) is suppressed.

In other words, in the exemplary embodiment, by partially providing the metal contact layer 137 on the surface of the transparent conductive layer 131 on the metal reflection layer 133 side, deterioration in brightness of the semiconductor light-emitting element 10 is suppressed compared to the case where a film of a metal such as nickel (Ni) is formed on the entire surface of the transparent conducive layer 131.

(Metal Reflection Layer 133)

In the exemplary embodiment, the metal reflection layer 133 is formed to cover substantially an entire region of the insulating reflection layer 132. Specific examples of the material constituting the metal reflection layer 133 include Al (aluminum) and an Al (aluminum)-Nd (neodymium) alloy. Of these, the Al (aluminum)-Nd (neodymium) alloy is preferable. Use of the Al (aluminum)-Nd (neodymium) alloy as the metal reflection layer 133 improves heat resistance and suppresses deterioration of reflective properties of the metal reflection layer 133.

Further, in the exemplary embodiment, since Ag (silver) is precluded from the metal reflection layer 133 and Al (aluminum) or the Al (aluminum)-Nd (neodymium) alloy is used, leakage current or the like due to migration phenomenon is suppressed.

In the exemplary embodiment, the thickness of the metal reflection layer 133 is selected from a range of 50 nm to 200 nm, and preferably selected from a range of 80 nm to 150 nm.

(N-Electrode Layer 140)

In the exemplary embodiment, the n-electrode layer 140 is formed by laminating a first conductive layer 141 containing Ni (nickel), a second conductive layer 142 containing the Al (aluminum)-Nd (neodymium) alloy, a third conductive layer 143a containing Ta (tantalum), a fourth conductive layer 143b containing Pt (platinum), the n-electrode bonding layer 144 containing Ag (gold) and an n-electrode adhesive layer 145 containing Ti (titanium) in order from the n-type semiconductor layer 123 side.

As the conditions for the sputtering method for forming the first conductive layer 141 containing Ni (nickel), conditions similar to those for forming the metal contact layer 137 with Ni (nickel) are employed. That is, it is considered that, in the case of a thin film having a thickness of the order of 2 nm (5 nm or less), the first conductive layer 141 containing Ni (nickel) formed by the sputtering method under the conditions of low temperature and high pressure has an island film structure.

On the first conductive layer 141 having this kind of structure, the second conductive layer 142 containing the Al (aluminum)-Nd (neodymium) alloy is formed. On this occasion, it is considered that Al (aluminum) metal contained in the second conductive layer 142 enters into the Ni (nickel) metal layer having island film structure, and the second conductive layer 142 is formed such that part thereof is slightly brought into contact with the n-type semiconductor layer 123. Usually, Ni (nickel) having high work function compared to Al (aluminum) has characteristics to hardly make an ohmic contact with the n-type semiconductor layer 123 in the case of being composed of GaN. However, in the exemplary embodiment, it is considered that an ohmic contact between the first conductive layer 141 and the n-type semiconductor layer 123 is available while being interposed with the Ni (nickel) metal film by the action of Al (aluminum) metal entered into the Ni (nickel) metal film.

It should be noted that, in the n-electrode layer 140, part of the protecting layer 150 and the n-electrode adhesive layer 145 is cutout by a known photolithographic technology to expose part of the n-electrode bonding layer 144 for forming the plated bump 24 (refer to FIG. 11), which will be described later, to be used for flip-chip mounting.

Next, description will be given of materials for each of other layers constituting the semiconductor light-emitting element 10.

(Substrate 110)

As the substrate 110, there is no particular limitation on any substrate as long as group III nitride semiconductor crystals are epitaxially grown on a surface thereof, and accordingly, various kinds of substrate may be selected and used. However, as will be described later, since the semiconductor light-emitting element 10 of the exemplary embodiment is flip-chip mounted so that the light is extracted from the substrate 110 side, it is preferable to have transparency to the light emitted from the light-emitting layer 124. Accordingly, the substrate 110 composed of, for example, sapphire, zinc oxide, magnesium oxide, zirconium oxide, magnesium-aluminum oxide, gallium oxide, indium oxide, lithium-gallium oxide, lithium-aluminum oxide, neodium-gallium oxide, lanthanum-strontium-aluminum-tantalum oxide, strontium-titanium oxide, titanium oxide and the like can be used. Among the above-described materials, it is preferable to use sapphire in which C-face is a principal surface as the substrate 110.

(Intermediate Layer 121)

The intermediate layer 121 is preferably composed of polycrystal $Al_xGa_{1-x}N$ (0≤x≤1), and more preferably, composed of single crystal $Al_xGa_{1-x}N$ (0≤x≤1). The intermediate layer 121 can be, for example, composed of polycrystal $Al_xGa_{1-x}N$ (0≤x≤1) with a thickness of 0.01 μm to 0.5 μm. If the thickness of the intermediate layer 121 is less than 0.01 μm, there are some cases where an effect of the intermediate layer 121 to mediate the difference in lattice constant between the substrate 110 and the base layer 122 cannot be sufficiently obtained. On the other hand, if the thickness of the intermediate layer 121 is more than 0.5 μm, there is a possibility that the time of forming process of the intermediate layer 121 becomes longer though there is no change to the function of the intermediate layer 121, and accordingly the productivity is decreased. The intermediate layer 121 has a function of mediating the difference in lattice constant between the substrate 110 and the base layer 122 to facilitate the formation of a single crystal layer which is C-axis oriented above the (0001) surface (C-face) of the substrate 110. Consequently, on the intermediate layer 121, the base layer 122 having more excellent crystallinity can be laminated.

Further, the intermediate layer 121 may have a crystal structure of a hexagonal system composed of the group III nitride semiconductor. Moreover, as the crystal of the group III nitride semiconductor constituting the intermediate layer 121, the crystal having a single crystal structure is preferably used. Crystals of the group III nitride semiconductor grow not only in an upper direction but also in an in-plane direction to form a single crystal structure by controlling growing conditions. Accordingly, the intermediate layer 121 can be composed of the group III nitride semiconductor crystals having single crystal structure by controlling layer forming conditions of the intermediate layer 121. In the case where the intermediate layer 121 having such a single crystal structure is formed on the substrate 110, the buffer function of the intermediate layer 121 effectively works, and thereby the group III nitride semiconductor formed thereon becomes a crystal film having excellent orientation property and crystallinity.

(Base Layer 122)

As the base layer 122, $Al_xGa_yIn_zN$ ($0 \leq x \leq 1$, $0 \leq y \leq 1$, $0 \leq z \leq 1$, $x+y+z=1$) can be used, but it is preferable to use $Al_xGa_{1-x}N$ ($0 \leq x < 1$) because the base layer 122 with excellent crystallinity can be formed.

The thickness of the base layer 122 is preferably 0.1 μm or more, more preferably 0.5 μm or more, and most preferably 1 μm or more. The $Al_xGa_{1-x}N$ layer having excellent crystallinity is likely to be obtained with these layer thickness or more. Further, in terms of production cost, the thickness of the base layer 122 is preferably 15 μm or less, and more preferably 10 μm or less.

To improve the crystallinity of the base layer 122, it is desirable that the base layer 122 is not doped with impurities. However, if conductivity of p-type or n-type is needed, acceptor impurities or donor impurities can be added.

(Laminated Semiconductor Layer 126)

Figure 4:
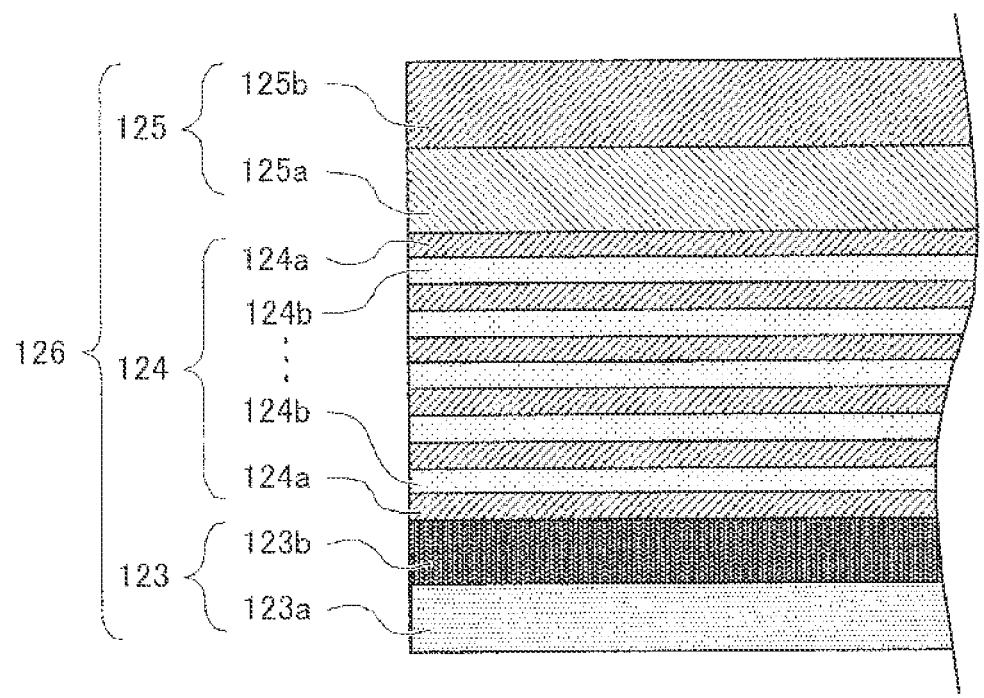
FIG. 4 is a cross-sectional schematic view illustrating a specific example of a laminated semiconductor layer.

FIG. 4 is a cross-sectional schematic view illustrating a specific example of the laminated semiconductor layer 126. The laminated semiconductor layer 126 is composed of, for example, a group III nitride semiconductor, which is configured by laminating the n-type semiconductor layer 123, the light-emitting layer 124 and the p-type semiconductor layer 125 above the substrate 110 in this order. In the exemplary embodiment, each layer of the laminated semiconductor layer 126 is configured by plural semiconductor layers. It should be noted that the laminated semiconductor layer 126 is assumed to further include the base layer 122 and the intermediate layer 121 in some cases. Here, the n-type semiconductor layer 123 performs electrical conduction in which an electron is a carrier, while the p-type semiconductor layer 125 performs electrical conduction in which a hole is a carrier. It should be noted that the laminated semiconductor layer 126 with excellent crystallinity can be obtained by an MOCVD method; however, a sputtering method under optimized conditions can form the laminated semiconductor layer 126 having more excellent crystallinity than that formed by the MOCVD method.

(N-Type Semiconductor Layer 123)

As shown in FIG. 4, the n-type semiconductor layer 123, in which an electron is a carrier, is preferably configured with an n-contact layer 123a and an n-cladding layer 123b. It should be noted that the n-contact layer 123a can also serve as the n-cladding layer 123b. Further, the above-described base layer 122 may be included in the n-type semiconductor layer 123.

The n-contact layer 123a is a layer for providing the n-electrode layer 140. The n-contact layer 123a is preferably configured with the $Al_xGa_{1-x}N$ layer ($0 \leq x < 1$, preferably $0 \leq x \leq 0.5$, and more preferably $0 \leq x \leq 0.1$).

Further, the n-contact layer 123a is preferably doped with n-type impurities, and preferably contains the n-type impurities having a density of $1 \times 10^{17}/cm^3$ to $1 \times 10^{20}/cm^3$, and preferably a density of $1 \times 10^{18}/cm^3$ to $1 \times 10^{19}/cm^3$ on the point that a good ohmic contact with the n-electrode layer 140 can be maintained. The n-type impurities are not particularly limited, however, Si, Ge, Sn and so on are provided, and Si and Ge are preferably provided.

The thickness of the n-contact layer 123a is preferably set to 0.5 μm to 5 μm, and more preferably set in a range of 1 μm to 3 μm. If the thickness of the n-contact layer 123a is in the above-described ranges, crystallinity of the semiconductor is suitably maintained.

It is preferable to provide the n-cladding layer 123b between the n-contact layer 123a and the light-emitting layer 124. The n-cladding layer 123b performs injection of the carriers into the light-emitting layer 124 and confinement of the carriers. The n-cladding layer 123b can be formed of AlGaN, GaN, GaInN and so on. It should be noted that, in this specification, materials are referred to as, for example, AlGaN or GaInN with the compositional ratio of each element omitted. Further, the hetero junction structure or the superlattice structure in which the layer is laminated plural times of these structures may also be used. When the n-cladding layer 123b is formed of GaInN, the band gap thereof is preferably larger than that of GaInN of the light-emitting layer 124.

The thickness of the n-cladding layer 123b is not particularly limited, but preferably in a range of 0.005 μm to 0.5 μm, and more preferably in a range of 0.005 μm to 0.1 μm. The n-type doping concentration of the n-cladding layer 123b is preferably in a range of $1 \times 10^{17}/cm^3$ to $1 \times 10^{20}/cm^3$, and more preferably in a range of $1 \times 10^{18}/cm^3$ to $1 \times 10^{19}/cm^3$. It is preferable to provide the doping concentration in these ranges in terms of maintaining excellent crystallinity and reducing operation voltage of the light-emitting element.

It should be noted that, in the case where the n-cladding layer 123b is a layer containing the superlattice structure, the layer may contain a structure in which an n-side first layer composed of the group III nitride semiconductor with a thickness of 100 angstrom or less and an n-side second layer having a different composition from the n-side first layer and composed of the group III nitride semiconductor with a thickness of 100 angstrom or less are laminated, though detailed illustration is omitted. Further, the n-cladding layer 123b may contain a structure in which the n-side first layers and the n-side second layers are alternately and repeatedly laminated, and the structure is preferably an alternating structure of GaInN and GaN or an alternating structure of GaInN having different compositions.

(Light-Emitting Layer 124)

As the light-emitting layer 124 laminated on the n-type semiconductor layer 123, a single quantum well structure or a multiple quantum well structure can be employed. As a well layer 124b having a quantum well structure, the group III nitride semiconductor layer composed of $Ga_{1-y}In_yN$ ($0 < y < 0.4$) is usually used. The thickness of the well layer 124b may be the thickness by which quantum effects can be obtained, for example, 1 nm to 10 nm, and preferably 2 nm to 6 nm in terms of light emission output.

Moreover, in the case of the light-emitting layer 124 having the multiple quantum well structure, the above-described $Ga_{1-y}In_yN$ is employed as the well layer 124b, and $Al_zGa_{1-z}N$ ($0 \leq z < 0.3$) having a band gap energy larger than that of the well layer 124b is employed as a barrier layer 124a. The well layer 124b and the barrier layer 124a may be doped or not doped with impurities depending upon a design thereof. It should be noted that, in the exemplary embodiment, the light-emitting layer 124 is configured to output blue light (light emission wavelength of the order of λ=400 nm to 465 nm).

(P-Type Semiconductor Layer 125)

The p-type semiconductor layer 125, in which a hole is a carrier, is usually configured with the p-cladding layer 125a and the p-contact layer 125b. Further, the p-contact layer 125b can also serve as the p-cladding layer 125a. The p-cladding layer 125a performs confinement of carriers within the light-emitting layer 124 and injection of carriers. The p-cladding layer 125a is not particularly limited as long as the band gap energy of the composition thereof is larger than that of the light-emitting layer 124 and carriers can be confined within the light-emitting layer 124, but is preferably composed of $Al_xGa_{1-x}N$ (0<x≤0.4).

It is preferable that the p-cladding layer 125a is composed of such AlGaN in terms of confinement of carriers within the light-emitting layer 124. The thickness of the p-cladding layer 125a is not particularly limited, but preferably 1 nm to 400 nm, and more preferably 5 nm to 100 nm. The p-type doping concentration of the p-cladding layer 125a is preferably $1 \times 10^{18}/cm^3$ to $1 \times 10^{21}/cm^3$, and more preferably $1 \times 10^{19}/cm^3$ to $1 \times 10^{20}/cm^3$. If the p-type doping concentration is in the above ranges, excellent p-type crystals can be obtained without deteriorating crystallinity. Further, the p-cladding layer 125a may have a superlattice structure in which the layer is laminated plural times of these structures, and preferably has an alternating structure of AlGaN and AlGaN or an alternating structure of AlGaN and GaN.

The p-contact layer 125b is a layer for providing the p-electrode layer 130. The p-contact layer 125b is preferably composed of $Al_xGa_{1-x}N$ (0≤x≤0.4). It is preferable that Al composition is in the above-described range in terms of allowing to maintain excellent crystallinity and good ohmic contact with the p-electrode layer 130. It is preferable to contain p-type impurities (dopants) in a concentration of $1 \times 10^{18}/cm^3$ to $1 \times 10^{21}/cm^3$, and preferably $5 \times 10^{19}/cm^3$ to $5 \times 10^{20}/cm^3$ in terms of maintaining good ohmic contact, preventing cracking and maintaining excellent crystallinity. The p-type impurities are not particularly limited, but, for example, Mg is preferably provided. The thickness of the p-contact layer 125b is not particularly limited, but is preferably 10 nm to 500 nm, and more preferably 50 nm to 200 nm. It is preferable to provide the thickness of the p-contact layer 125b in these ranges in terms of light emission output.

(P-Electrode Diffusion-Preventing Layer 134)

The p-electrode diffusion-preventing layer 134 suppresses diffusion of a metal constituting the metal reflection layer 133 in a contact state with the p-electrode diffusion-preventing layer 134. It is preferable to use each layer in the p-electrode diffusion-preventing layer 134 capable of making an ohmic contact with a layer to contact, and has a small contact resistance with the layer to contact. In the exemplary embodiment, Ta (tantalum) and Pt (platinum) are used as the first p-electrode diffusion-preventing layer 134a and the second p-electrode diffusion-preventing layer 134b, respectively, in the p-electrode diffusion-preventing layer 134.

(P-Electrode Bonding Layer 135)

In the exemplary embodiment, Au (gold) is used as the p-electrode bonding layer 135.

(P-Electrode Adhesive Layer 136)

The p-electrode adhesive layer 136 is provided to improve physical adhesive properties between the p-electrode bonding layer 135 configured with Au (gold) and the protecting layer 150. In the exemplary embodiment, the p-electrode adhesive layer 136 is formed of Ti (titanium). However, other than Ti, for example, it is possible to use Ta (tantalum) or Ni (nickel).

(Protecting Layer 150)

The protecting layer 150 is formed of silicon oxide such as $SiO_2$. The thickness of the protecting layer 150 is usually provided in a range of 50 nm to 1 μm. If the thickness of the protecting layer 150 is excessively thin, there is a possibility of losing the function as the protecting layer, and besides, there is a tendency that the light emission output is reduced in a short period of time depending upon a use environment. Further, if the thickness of the protecting layer 150 is excessively thick, there is a tendency that costs are increased or cracking occurs.

It should be noted that, in the p-electrode layer 130 of the semiconductor light-emitting element 10, at each of four portions that are close to four corners of the semiconductor light-emitting element 10, part of the protecting layer 150 and the p-electrode adhesive layer 136 is cutout by a known photolithographic technology to expose part of the p-electrode bonding layer 135 for forming the plated bump 25 (refer to FIG. 11), which will be described later, to be used for flip-chip mounting.

Next, other exemplary embodiments of the semiconductor light-emitting element 10 will be described.

(Second Exemplary Embodiment)

Figure 5:
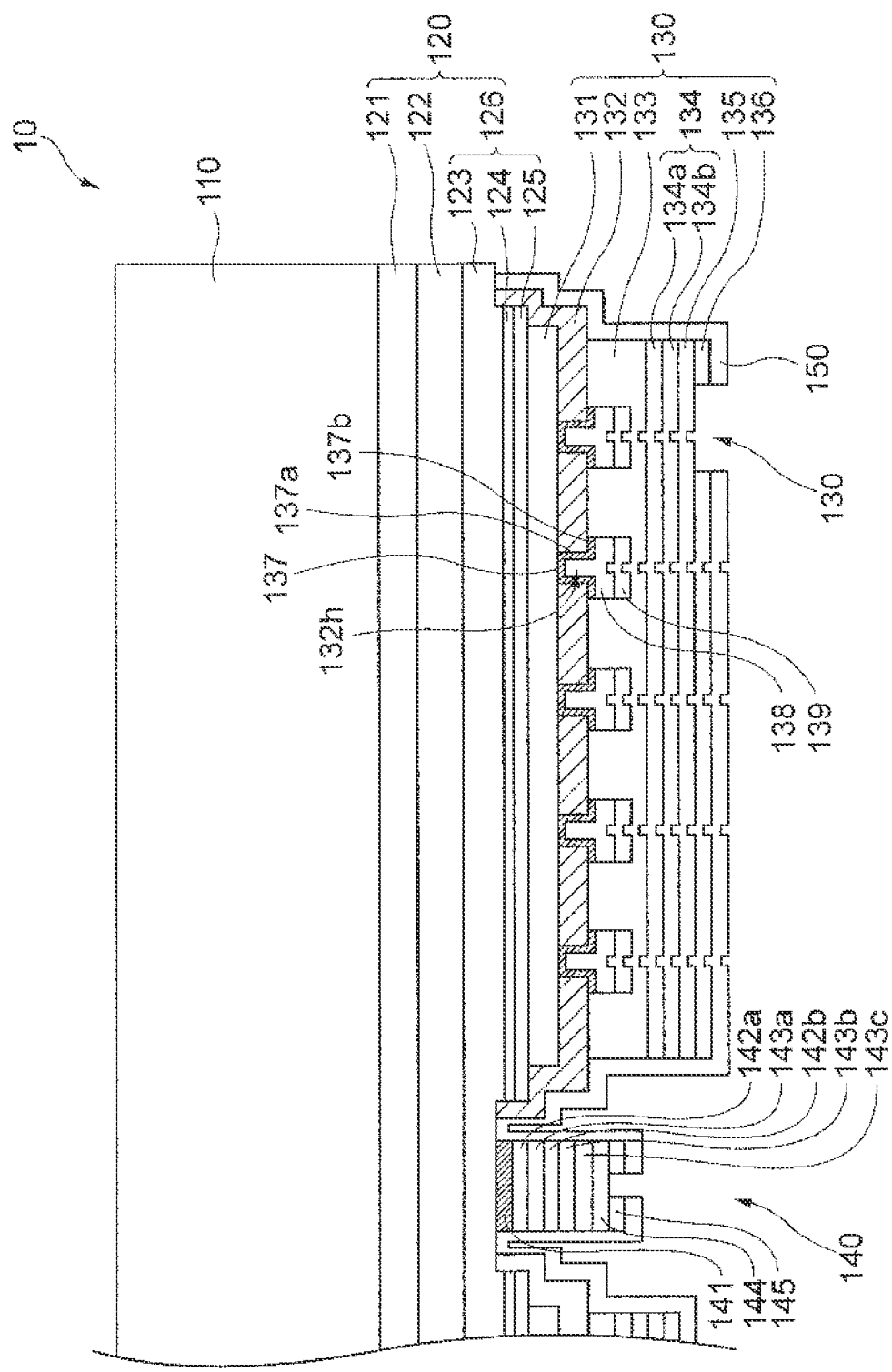
FIG. 5 is a cross-sectional schematic view illustrating a second exemplary embodiment of the semiconductor light-emitting element.

FIG. 5 is a cross-sectional schematic view illustrating a second exemplary embodiment of the semiconductor light-emitting element 10. It should be noted that the same components as those of the exemplary embodiment shown in FIG. 2 will be assigned the same signs and names to indicate the same components or members, or those having the same characteristics, and detailed description thereof will be omitted.

In the opening portion 132h having been provided in the insulating reflection layer 132 of the semiconductor light-emitting element 10 shown in FIG. 5, the metal contact layer 137 is formed at least between a portion of the transparent conductive layer 131 exposed at the opening portion 132h and a portion of the metal reflection layer 133 formed in the opening portion 132h. Further, in the metal contact layer 137, a side surface portion 137a thereof formed on a side surface inside the opening portion 132h of the insulating reflection layer 132 and a peripheral portion 137b formed around the periphery of the opening portion 132h, which is on a surface of the insulating reflection layer 132 on the metal reflection layer 133 side, are integrally formed.

Further, in the exemplary embodiment, an Al-containing metal layer (first metal layer) 138 that contains same elements as those of the metal reflection layer 133 and a second metal layer 139 containing Ta (tantalum) or Ni (nickel) are laminated in order between the metal contact layer 137 and the metal reflection layer 133.

In the Al-containing metal layer (first metal layer) 138, Al (aluminum) or the Al (aluminum)-Nd (neodymium) alloy is contained. In the second metal layer 139, other than Ta (tantalum) or Ni (nickel), Ti (titanium) or the like may be contained.

As shown in FIG. 5, the Al-containing metal layer (first metal layer) 138 and the second metal layer 139 are laminated on the metal contact layer 137 within an outer edge portion of the peripheral portion 137b formed around the opening portion 132h of the metal contact layer 137 as a limit. The metal reflection layer 133 is formed to cover the Al-containing metal layer (first metal layer) 138 and the second metal layer 139 laminated on the metal contact layer 137, and is also laminated on the insulating reflection layer 132.

By further laminating the Al-containing metal layer (first metal layer) 138 and the second metal layer 139 containing Ta (tantalum) or Ni (nickel) on the metal contact layer 137 formed inside the opening portion 132h in the insulating reflection layer 132, oxidation of aluminum contained in the metal reflection layer 133 is further suppressed compared to the first exemplary embodiment shown in FIG. 2.

Moreover, in the exemplary embodiment shown in FIG. 5, the n-electrode layer 140 is formed by laminating the first conductive layer 141 containing Ni (nickel), a second conductive layer 142a containing an Al (aluminum)-Nd (neodymium) alloy, a third conductive layer 143a containing Ta (tantalum), a fourth conductive layer 142b containing an Al (aluminum)-Nd (neodymium) alloy, a fifth conductive layer 143b containing Ta (tantalum), a sixth conductive layer 143c containing Pt (platinum), the n-electrode bonding layer 144 containing Ag (gold) and an n-electrode adhesive layer 145 containing Ti (titanium) in order from the n-type semiconductor layer 123 side.

It should be noted that, in the n-electrode layer 140, part of the protecting layer 150 and the n-electrode adhesive layer 145 is cutout by a known photolithographic technology to expose part of the n-electrode bonding layer 144 for forming the plated bump 24 (refer to FIG. 11), which will be described later, to be used for flip-chip mounting.

(Third Exemplary Embodiment)

Figure 6:
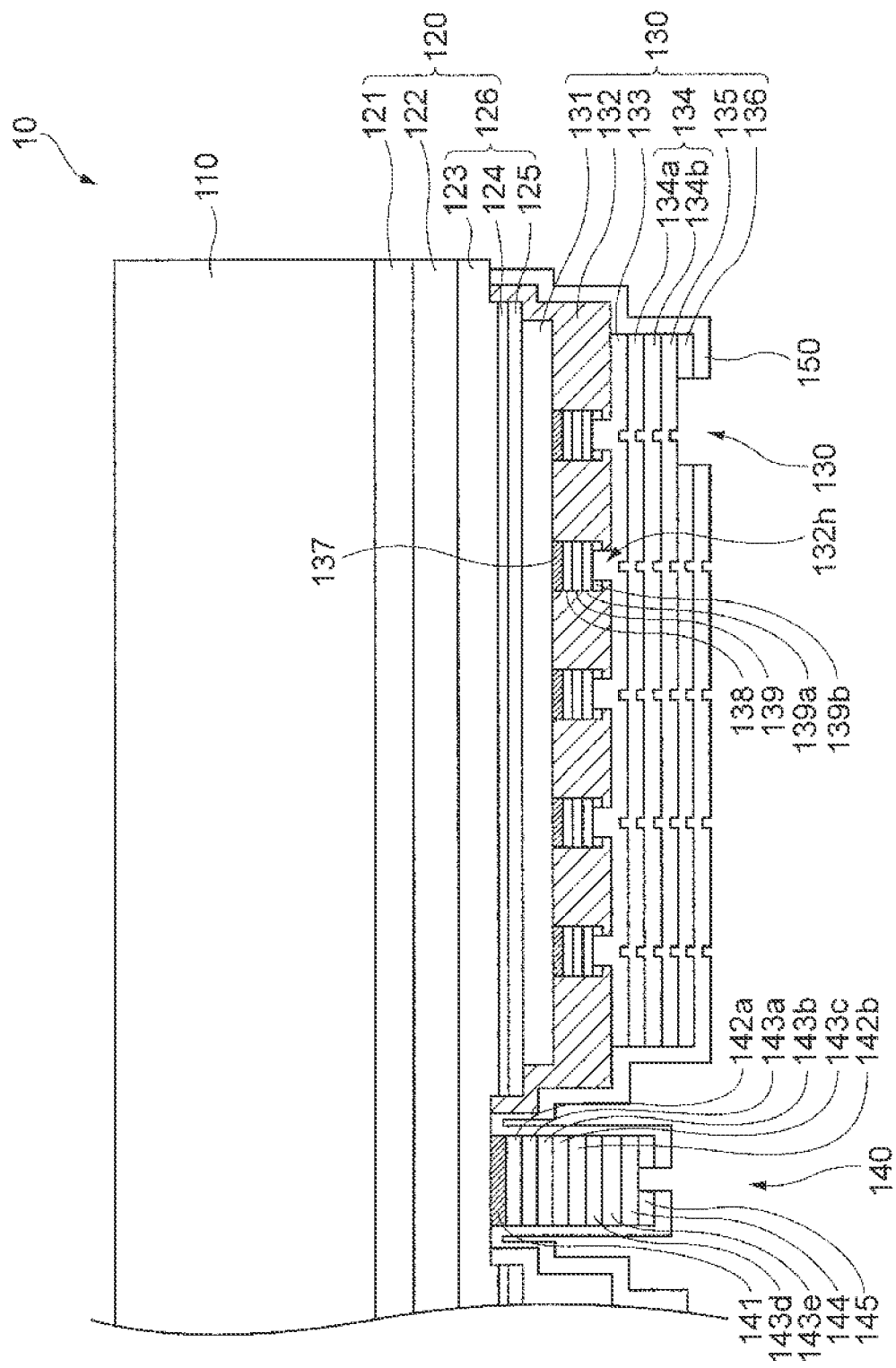
FIG. 6 is a cross-sectional schematic view illustrating a third exemplary embodiment of the semiconductor light-emitting element.

FIG. 6 is a cross-sectional schematic view illustrating a third exemplary embodiment of the semiconductor light-emitting element 10. It should be noted that the same components as those of the exemplary embodiment shown in FIG. 2 will be assigned the same signs and names to indicate the same components or members, or those having the same characteristics, and detailed description thereof will be omitted.

In the opening portion 132h having been provided in the insulating reflection layer 132 of the semiconductor light-emitting element 10 shown in FIG. 6, the metal contact layer 137 is formed at least between a portion of the transparent conductive layer 131 exposed at the opening portion 132h and a portion of the metal reflection layer 133 formed in the opening portion 132h. Further, in the exemplary embodiment, the Al-containing metal layer (first metal layer) 138 that contains same elements as those of the metal reflection layer 133, the second metal layer 139 containing Ta (tantalum) or Ni (nickel), a third metal layer 139a containing Pt (platinum) and a fourth metal layer 139b containing Ta (tantalum) or Ni (nickel) are laminated in order between the metal contact layer 137 and the metal reflection layer 133.

As shown in FIG. 6, part of the metal reflection layer 133 is formed inside the opening portion 132h where the fourth metal layer 139b is not formed, and is connected with the third metal layer 139a. This forms a conductive body portion that makes electrical conduction between the transparent conductive layer 131 and the metal reflection layer 133 in the opening portion 132h. In the Al-containing metal layer (first metal layer) 138, Al (aluminum) or an Al (aluminum)-Nd (neodymium) alloy is contained. In the second metal layer 139 and the fourth metal layer 139b, Ti (titanium) or the like may be contained other than Ta (tantalum) or Ni (nickel).

In the exemplary embodiment shown in FIG. 6, the n-electrode layer 140 is formed by laminating the first conductive layer 141 containing Ni (nickel), the second conductive layer 142a containing the Al (aluminum)-Nd (neodymium) alloy, the third conductive layer 143a containing Ta (tantalum), a fourth conductive layer 143b containing Pt (platinum), a fifth conductive layer 143c containing Ta (tantalum), a sixth conductive layer 142b containing the Al (aluminum)-Nd (neodymium) alloy, a seventh conductive layer 143d containing Ta (tantalum), an eighth conductive layer 143e containing Pt (platinum), the n-electrode bonding layer 144 containing Ag (gold) and the n-electrode adhesive layer 145 containing Ti (titanium) in order from the n-type semiconductor layer 123 side.

It should be noted that, in the n-electrode layer 140, part of the protecting layer 150 and the n-electrode adhesive layer 145 is cutout by a known photolithographic technology to expose part of the n-electrode bonding layer 144 for forming the plated bump 24 (refer to FIG. 11), which will be described later, to be used for flip-chip mounting.

(Fourth Exemplary Embodiment)

Figure 7:
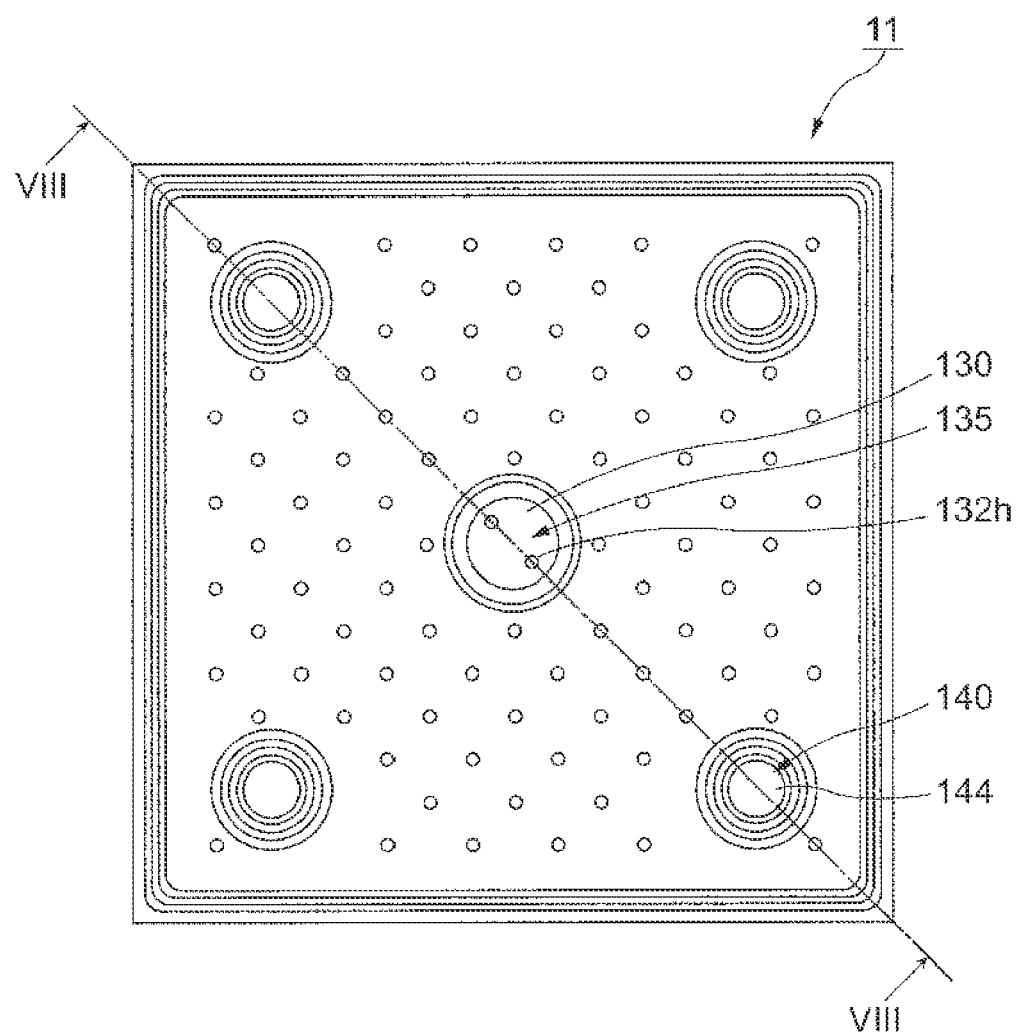
FIG. 7 is a plan schematic view illustrating a fourth exemplary embodiment, which is another specific example of arrangement of electrodes in the semiconductor light-emitting element.

FIG. 7 is a plan schematic view illustrating a fourth exemplary embodiment, which is another specific example of arrangement of electrodes in the semiconductor light-emitting element. It should be noted that the same components as those of the exemplary embodiment shown in FIG. 2 will be assigned the same signs and names to indicate the same components or members, or those having the same characteristics.

A semiconductor light-emitting element 11 shown in FIG. 7 has a square planar shape. The p-electrode layer 130 is formed to cover substantially an entire top surface of the semiconductor layer 120 except for a portion where a part of the semiconductor layer 120 is removed by etching or the like for forming the n-electrode layer 140. In the p-electrode layer 130 as a positive electrode, part of the p-electrode bonding layer 135 used for electrical connection with an outside is exposed in the center portion of the semiconductor light-emitting element 11. In the n-electrode layer 140 as a negative electrode, at each of four portions that are close to four corners of the semiconductor light-emitting element 11, part of the n-electrode bonding layer 144 used for electrical connection between the n-electrode layer 140 and the outside is exposed (referred to as "N-distribution type").

In the insulating reflection layer 132 (refer to FIG. 8) of the p-electrode layer 130, plural opening portions 132h are formed. The opening portion 132h is indicated as a circular blank portion (diameter is 8 µm). In FIG. 7, a pattern is shown in which the plural opening portions 132h are arranged with intervals (pitch 1) in the entire insulating reflection layer 132 (refer to FIG. 8) (referred to as "isolation pattern").

Next, description will be given of a cross-sectional structure of the semiconductor light-emitting element 11.

Figure 8:
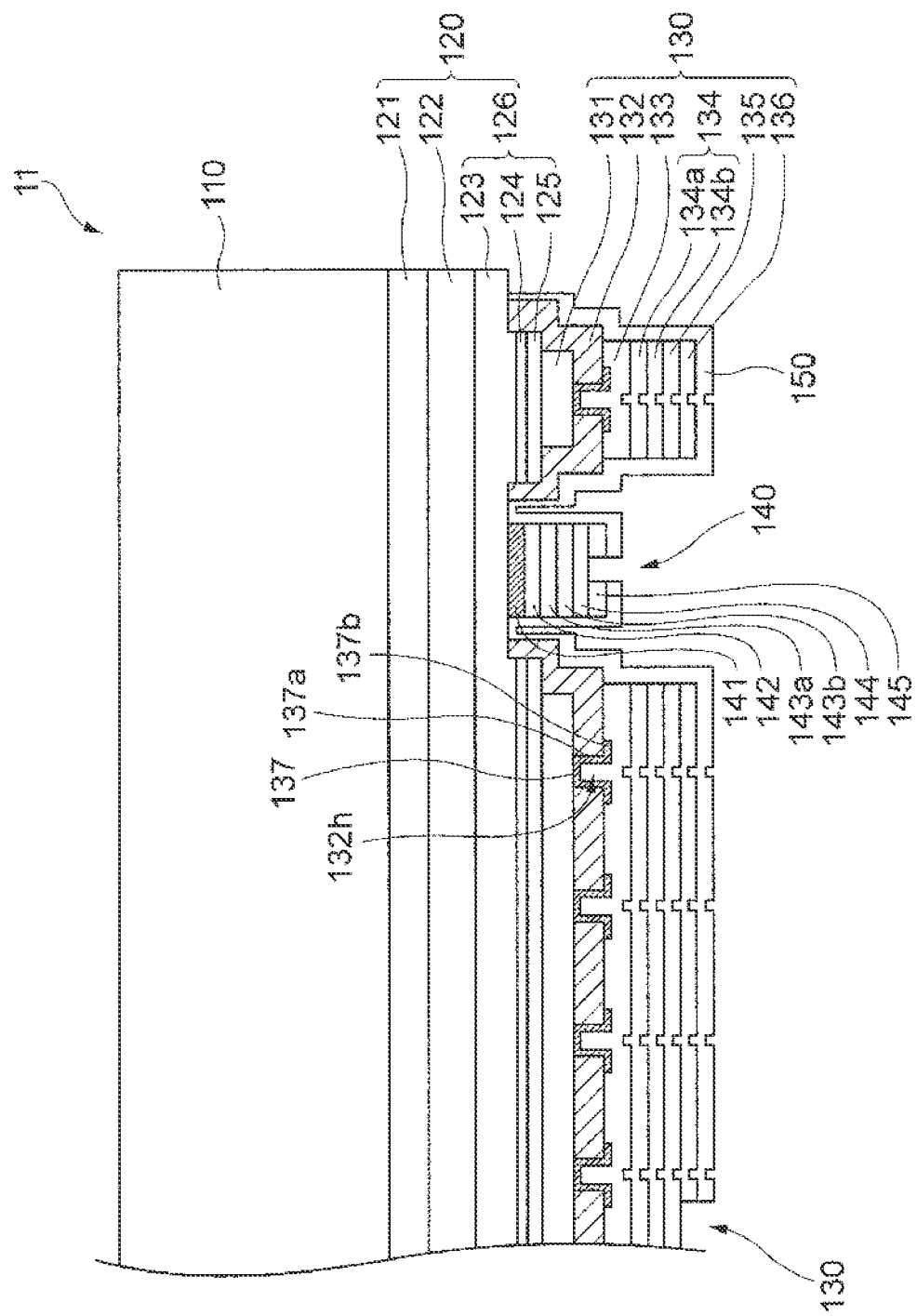
FIG. 8 is a VIII-VIII cross-sectional schematic view showing the semiconductor light-emitting element shown in FIG. 7.

FIG. 8 is a VIII-VIII cross-sectional schematic view showing the semiconductor light-emitting element 11 shown in FIG. 7. The same components as those of the exemplary embodiments shown in FIGS. 2 to 6 will be assigned the same signs and names to indicate the same components or members, or those having the same characteristics, and detailed description thereof will be omitted.

As shown in FIG. 8, the semiconductor light-emitting element 11 has a layer structure similar to that of the semiconductor light-emitting element 10 described in the exemplary embodiment shown in FIG. 2. That is, the semiconductor light-emitting element 11 includes the substrate 110, the semiconductor layer 120 laminated on the substrate 110, the p-electrode layer 130 formed on the p-type semiconductor layer 125 of the semiconductor layer 120 and the n-electrode layer 140 formed on an exposed surface in which part of the n-type semiconductor layer 123 of the semiconductor layer 120 is exposed.

In the p-electrode layer 130 as a positive electrode, part of the center portion of the protecting layer 150, which covers the surface of the semiconductor light-emitting element 11, and the p-electrode adhesive layer 136 is removed to expose part of the p-electrode bonding layer 135, to thereby make electrical connection with the outside through the plated bump 25 (refer to FIG. 12) to be described later. In each of the n-electrode layers 140 as negative electrodes formed to be distributed at four corners on the semiconductor layer 120, part of the protecting layer 150, which covers the surface of the semiconductor light-emitting element 11, and the n-electrode adhesive layer 145 is removed to expose part of the n-electrode bonding layer 144, to thereby make electrical connection with the outside through the plated bump 24 (refer to FIG. 12) to be described later.

Compared to the above-described semiconductor light-emitting element 10, the semiconductor light-emitting element 11 of the N-distribution type shown in FIGS. 7 and 8 indicates a tendency to suppress concentration of light emitted from the light-emitting layer 124 to the center portion of the semiconductor light-emitting element 11.

In the insulating reflection layer 132 of the semiconductor light-emitting element 11, similar to the exemplary embodiment shown in FIG. 2 (semiconductor light-emitting element 10), the plural opening portions 132h are provided to expose part of the transparent conductive layer 131. Each of the opening portions 132h is formed to penetrate through the insulating reflection layer 132, and inside thereof, part of the metal reflection layer 133 is formed. The diameter of the opening portion 132h, the intervals (pitch 1) between the plural opening portions 132h and the ratio of the sum total of the area of the plural opening portions 132h to the entire area of the insulating reflection layer 132 (area occupancy rate) are selected from ranges similar to those in the case of the above-described semiconductor light-emitting element 10.

In the opening portion 132h, the metal contact layer 137 is formed at least between a portion of the transparent conductive layer 131 exposed at the opening portion 132h and a portion of the metal reflection layer 133 formed in the opening portion 132h. Further, in the metal contact layer 137, a side surface portion 137a thereof formed on a side surface inside the opening portion 132h of the insulating reflection layer 132 and a peripheral portion 137b formed around the periphery of the opening portion 132h, which is on a surface of the insulating reflection layer 132 on the metal reflection layer 133 side, are integrally formed. The elements contained in the metal contact layer 137 and the thickness of the metal contact layer 137 are selected from a group and a range, respectively, similar to those in the case of the above-described semiconductor light-emitting element 10.

In the semiconductor light-emitting element 11, similar to the exemplary embodiment shown in FIG. 2 (semiconductor light-emitting element 10), the metal reflection layer 133 is formed to cover substantially an entire region of the insulating reflection layer 132. The materials constituting the metal reflection layer 133 and the thickness of the metal reflection layer 133 are selected from a group and a range, respectively, similar to those in the case of the above-described semiconductor light-emitting element 10.

It should be noted that each of the plural n-electrode layers 140 of the semiconductor light-emitting element 11 has the layer structure similar to that in the exemplary embodiment shown in FIG. 2 (semiconductor light-emitting element 10).

(Fifth Exemplary Embodiment)

Figure 9:
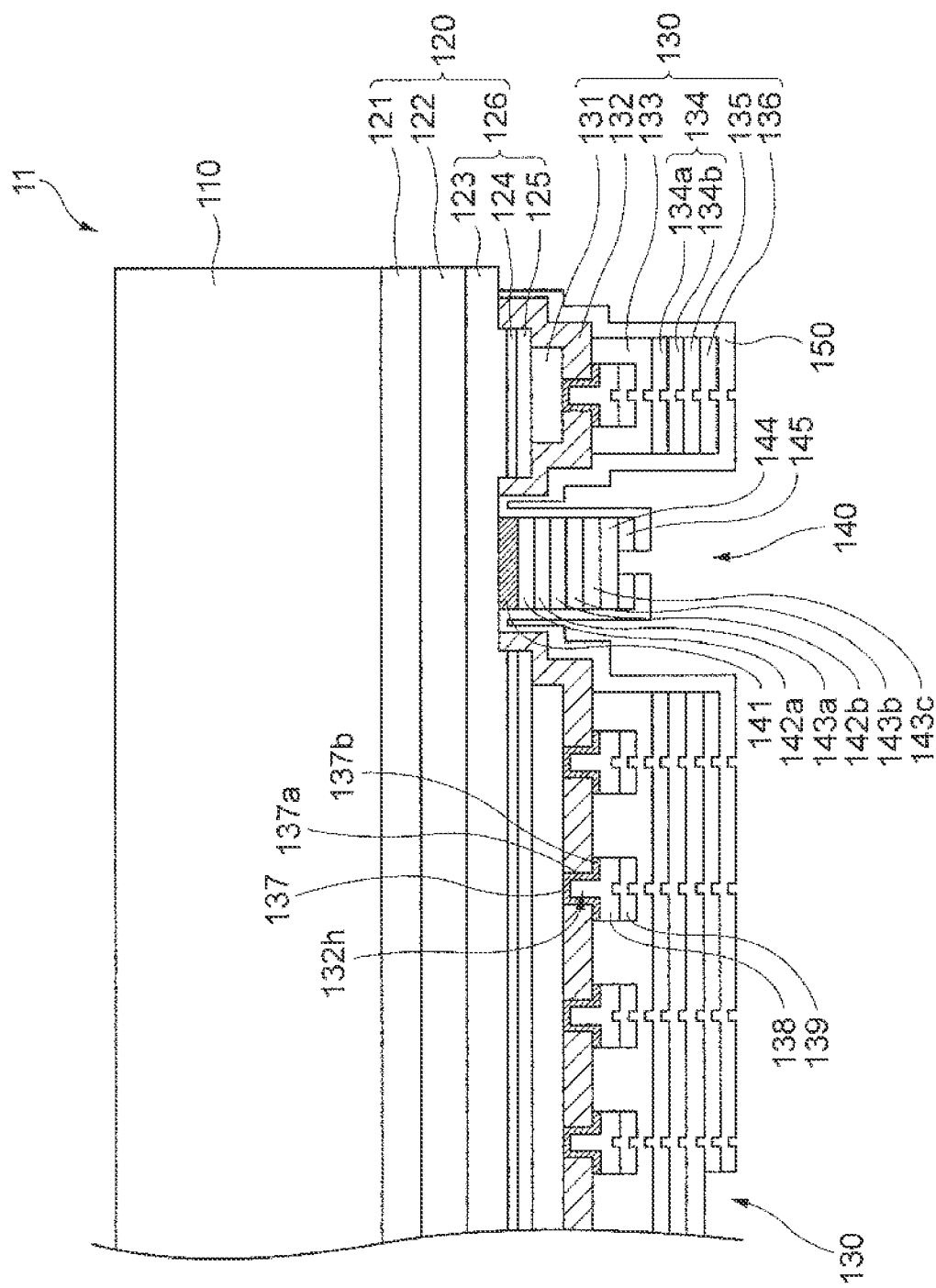
FIG. 9 is a cross-sectional schematic view illustrating a fifth exemplary embodiment of the semiconductor light-emitting element.

FIG. 9 is a cross-sectional schematic view illustrating a fifth exemplary embodiment of the semiconductor light-emitting element. The same components as those of the exemplary embodiment shown in FIGS. 7 and 8 (fourth exemplary embodiment) will be assigned the same signs and names to indicate the same components or members, or those having the same characteristics, and detailed description thereof will be omitted.

The semiconductor light-emitting element 11 shown in FIG. 9 has a layer structure similar to that of the semiconductor light-emitting element 10 described in the second exemplary embodiment shown in FIG. 5. That is, in the opening portion 132h having been provided in the insulating reflection layer 132, the metal contact layer 137 is formed at least between a portion of the transparent conductive layer 131 exposed at the opening portion 132h and a portion of the metal reflection layer 133 formed in the opening portion 132h. Further, in the metal contact layer 137, a side surface portion 137a thereof formed on a side surface inside the opening portion 132h of the insulating reflection layer 132 and a peripheral portion 137b formed around the periphery of the opening portion 132h, which is on a surface of the insulating reflection layer 132 on the metal reflection layer 133 side, are integrally formed.

Further, in the exemplary embodiment, the Al-containing metal layer (first metal layer) 138 and the second metal layer 139 are laminated in order between the metal contact layer 137 and the metal reflection layer 133. The elements contained in these layers are selected from a group similar to that in the case of the above-described second exemplary embodiment (semiconductor light-emitting element 10).

In the semiconductor light-emitting element 11, similar to the second exemplary embodiment shown in FIG. 5 (semiconductor light-emitting element 10), the metal reflection layer 133 is formed to cover the Al-containing metal layer (first metal layer) 138 and the second metal layer 139 laminated on the metal contact layer 137 and also cover the insulating reflection layer 132. The materials constituting the metal reflection layer 133 and the thickness of the metal reflection layer 133 are selected from a group and a range, respectively, similar to those in the case of the above-described semiconductor light-emitting element 10.

It should be noted that each of the plural n-electrode layers 140 of the semiconductor light-emitting element 11 has the layer structure similar to that in the second exemplary embodiment shown in FIG. 5 (semiconductor light-emitting element 10).

(Sixth Exemplary Embodiment)

Figure 10:
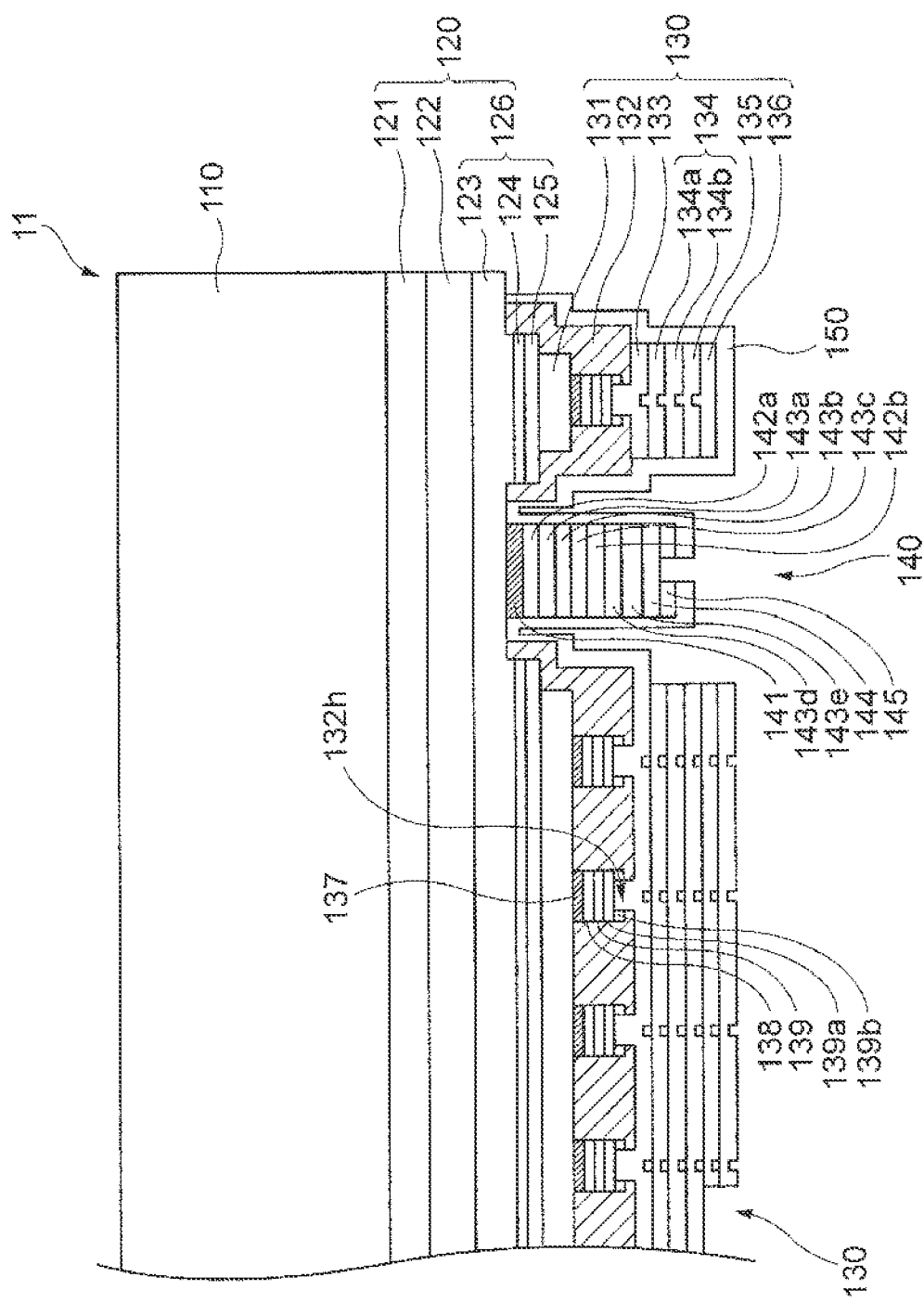
FIG. 10 is a cross-sectional schematic view illustrating a sixth exemplary embodiment of the semiconductor light-emitting element.

FIG. 10 is a cross-sectional schematic view illustrating a sixth exemplary embodiment of the semiconductor light-emitting element. The same components as those of the exemplary embodiment shown in FIGS. 7 and 8 (fourth exemplary embodiment) will be assigned the same signs and names to indicate the same components or members, or those having the same characteristics, and detailed description thereof will be omitted.

The semiconductor light-emitting element 11 shown in FIG. 10 has a layer structure similar to that of the semiconductor light-emitting element 10 described in the third exemplary embodiment shown in FIG. 6. That is, in the opening portion 132h having been provided in the insulating reflection layer 132, the metal contact layer 137 is formed at least between a portion of the transparent conductive layer 131 exposed at the opening portion 132h and a portion of the metal reflection layer 133 formed in the opening portion 132h. Further, between the metal contact layer 137 and the metal reflection layer 133, the Al-containing metal layer (first metal layer) 138, the second metal layer 139, the third metal layer 139a and the fourth metal layer 139b are laminated in order. It should be noted that the elements contained in these layers are selected from a group similar to that in the case of the above-described third exemplary embodiment (semiconductor light-emitting element 10).

As shown in FIG. 10, part of the metal reflection layer 133 is formed inside the opening portion 132h where the fourth metal layer 139b is not formed, and is connected with the third metal layer 139a. This forms a conductive body portion that makes electrical conduction between the transparent conductive layer 131 and the metal reflection layer 133 in the opening portion 132h. It should be noted that each of the plural n-electrode layers 140 of the semiconductor light-emitting element 11 has the layer structure similar to that in the third exemplary embodiment shown in FIG. 6 (semiconductor light-emitting element 10).

(Mounting Process onto Submount 20)

The semiconductor light-emitting elements 10 and 11 are, for example, mounted on a submount substrate 21 (refer to FIGS. 11 and 12) through the following operations. First, a layer of TiW/Au is formed on an entire surface of the wafer of the semiconductor light-emitting element 10 or 11 by a known sputtering method, then, a resist in which the n-electrode layer 140 and the p-electrode layer 130 are exposed by a known photolithographic technology is formed, and subsequent thereto, an Au layer having a predetermined thickness is grown above the n-electrode layer 140 and the p-electrode layer 130 by a known deposition method to form the plated bumps 24 and 25 (refer to FIGS. 11 and 12). Unnecessary parts of the resist and the TiW/Au layer are removed by a known etching technology or the like. A light-emitting chip is reversed and provided on a submount 20 using an AlN substrate (refer to FIGS. 11 and 12) to be described later, and the semiconductor light-emitting element 10 or 11 and the submount 20 are aligned so that submount wirings 22 and 23 and the plated bumps 24 and 25 of the semiconductor light-emitting element 10 correspond with each other, and thus electrically connected.

<Semiconductor Light-Emitting Devices 1 and 2>

Figure 11:
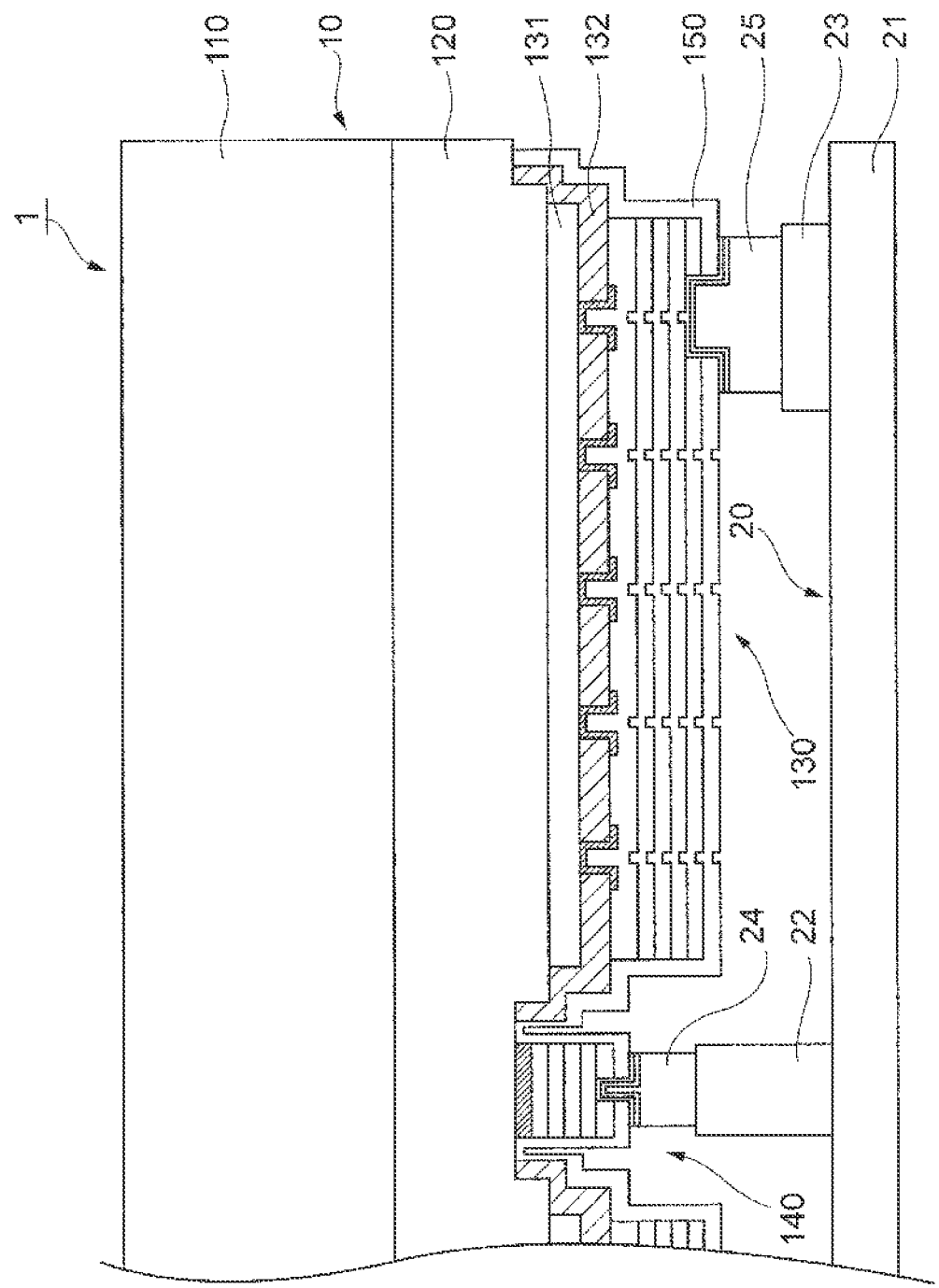
FIG. 11 is a cross-sectional schematic view illustrating a specific example of a semiconductor light-emitting device to which any one of the exemplary embodiments is applied.
Figure 12:
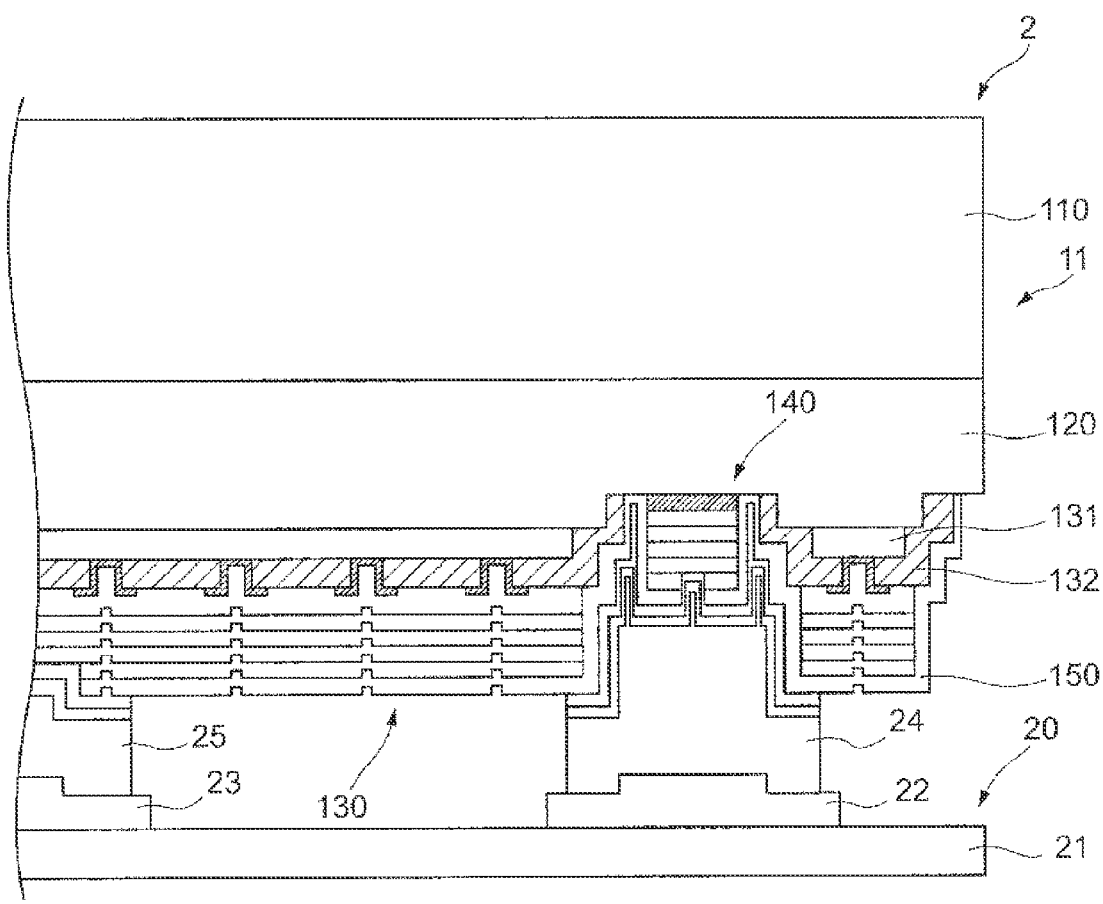
FIG. 12 is a cross-sectional schematic view illustrating another specific example of the semiconductor light-emitting device to which any one of the exemplary embodiments is applied.

FIG. 11 is a cross-sectional schematic view illustrating a specific example of a semiconductor light-emitting device to which any one of the exemplary embodiments is applied. FIG. 12 is a cross-sectional schematic view illustrating another specific example of the semiconductor light-emitting device to which any one of the exemplary embodiments is applied. Hereinafter, description will be given based on FIGS. 11 and 12.

In a semiconductor light-emitting device 1 shown in FIG. 11, the semiconductor light-emitting element 10 described with reference to FIGS. 1 and 2 is mounted on the submount substrate 21. The same configurations as those shown in FIGS. 1 and 2 will be assigned the same signs, and detailed description thereof will be omitted. In the semiconductor light-emitting device 2 shown in FIG. 12, the semiconductor light-emitting element 11 (N-distribution type) described with reference to FIGS. 7 and 8 is mounted on the submount substrate 21. The same configurations as those shown in FIGS. 7 and 8 will be assigned the same signs, and detailed description thereof will be omitted.

As shown in FIGS. 11 and 12, each of the semiconductor light-emitting elements 10 and 11 includes the submount 20 as a specific example of a circuit board that mounts each of the semiconductor light-emitting elements 10 and 11 thereon. The submount 20 secures the semiconductor light-emitting element 10 or 11 thereon and provides wirings for supplying electric power to the semiconductor light-emitting element 10 or 11. As shown in FIGS. 11 and 12, the semiconductor light-emitting devices 1 and 2 mount the semiconductor light-emitting elements 10 and 11, respectively, on the submounts 20 by flip-chip bonding.

The submount 20 includes: the submount substrate 21; the submount wirings 22 and 23 that are provided on the submount substrate 21; the plated bump 24 as a specific example of a connector that electrically connects the n-electrode layer 140 of the semiconductor light-emitting element 10 or 11 with the submount wirings 22; and the plated bump 25 as a specific example of a connector that electrically connects the p-electrode layer 130 of the semiconductor light-emitting element 10 or 11 with the submount wirings 23. In the exemplary embodiment, in the plated bumps 24 and 25, the main bodies are composed of gold (Ag), and portions to contact the surfaces of the n-electrode layer 140 and the p-electrode layer 130, respectively, are formed with two layers of TiW/Au by the sputtering method.

Of the light emitted from the light-emitting layer 124 (refer to FIGS. 2 and 8) of the semiconductor light-emitting element 10 or 11, light traveling toward the substrate 110 is extracted to the outside. On the other hand, of the light emitted from the light-emitting layer 124, light traveling toward the p-electrode layer 130 is reflected by the insulating reflection layer 132 and the metal reflection layer 133 provided on the p-electrode layer 130 and proceeds toward the substrate 110, and is extracted to the outside.

EXAMPLES

Hereinafter, the present invention will be described further in detail with reference to examples. However, the present invention is not limited to the following examples as long as the scope of the gist thereof is not exceeded.

Examples 1 and 2, Comparative Examples 1 and 2

The semiconductor light-emitting elements 10 respectively shown in FIG. 2 (first exemplary embodiment) and FIG. 5 (second exemplary embodiment) were prepared. The plural opening portions 132h were provided in the insulating reflection layer 132 having a multilayer structure, and the metal contact layer 137 composed of Ni (nickel) was formed between the transparent conductive layer 131 composed of IZO (indium zinc oxide) exposed at the opening portion 132h and the metal reflection layer 133 composed of the Al (aluminum)-Nd (neodymium) alloy.

It should be noted that the insulating reflection layer 132 has a laminated layer structure of 19 layers in total by sandwiching 9 layers of the second insulating reflection layers 132b between 10 layers of the first insulating reflection layers 132a. The first insulating reflection layer 132a is composed of $SiO_2$ (silicon dioxide) having a thickness $d_L=76$ nm. The second insulating reflection layer 132b is composed of $Ta_2O_5$ (tantalum oxide) having a thickness $d_H=51$ nm. The total thickness (H) of the insulating reflection layer 132 having the multilayer structure is 1218 nm. The diameter of the opening portion 132h is 8 µm, pitch 1 between the plural opening portions 132h is 40 µm, and the area occupancy rate is 5%.

Next, as shown in FIG. 11, the semiconductor light-emitting devices 1 in which these semiconductor light-emitting elements 10 are mounted onto the submounts 20 by flip-chip bonding were prepared. Subsequently, LED properties were measured for each of the semiconductor light-emitting devices 1.

It should be noted that, as Comparative Examples, the semiconductor light-emitting element was formed in each of two cases: a case of a configuration similar to that of the first exemplary embodiment except that the metal contact layer 137 composed of Ni (nickel) formed in Example 1 was formed on an entire surface of the insulating reflection layer 132 having a multilayer structure, including a space between the transparent conductive layer 131 exposed at the opening portion 132h and the metal reflection layer 133 (Comparative Example 1); and a case of a configuration similar to that of the first exemplary embodiment except that an insulating reflection layer of a single-layer structure using SiO$_2$ (silicon dioxide) was employed instead of the insulating reflection layer 132 having the multilayer structure formed in Example 1, the metal contact layer 137 was not formed, and the metal reflection layer 133 was composed of Ag (silver) (Comparative Example 2), and then, similar to Example 1, LED properties were measured. The results are shown in Tables 1 and 2.

In Tables 1 and 2, Vf indicates a forward voltage (unit: V) and Po indicates light emission output (unit: mW).

From the results shown in Table 1, it can be learned that the light emission outputs (Po: mW) of the semiconductor light-emitting devices 1 of the flip-chip bonding type prepared in Examples 1 and 2 are increased compared to the case where the metal contact layer 137 composed of Ni was formed on the entire surface of the insulating reflection layer 132 having the multilayer structure (Comparative Example 1) or the case where the conventional metal reflection layer composed of Ag was employed (Comparative Example 2).

The foregoing description of the present exemplary embodiments of the present invention has been provided for the purposes of illustration and description. It is not intended to be exhaustive or to limit the invention to the precise forms disclosed. Obviously, many modifications and variations will be apparent to practitioners skilled in the art. The present exemplary embodiments were chosen and described

TABLE 1

| | Transparent Conductive Layer | Insulating Reflection Layer | | Metal Contact Layer | | Metal Reflection | Forward Voltage Vf (V) | | | | |
|---|---|---|---|---|---|---|---|---|---|---|---|
| | Thickness (nm) | Layer Structure | Thickness (nm) | Material | Thickness of Ni (nm) | Layer Material | Vf 20 mA | Vf 80 mA | Vf 120 mA | Vf 160 mA | Vf 240 mA |
| Example 1 | 200 | Multi-Layer | 1218 | Ni | 2 | Al—Nd | 2.77 | 3.04 | 3.16 | 3.28 | 3.51 |
| Example 2 | 200 | Multi-Layer | 1218 | Ni/Al—Nd/Ta | 2 | Al—Nd | 2.74 | 2.95 | 3.06 | 3.16 | 3.33 |
| Comparative Example 1 | 200 | Multi-Layer | 1218 | Ni Entirely | 2 | Al—Nd | 2.75 | 2.95 | 3.05 | 3.14 | 3.31 |
| Comparative Example 2 | 200 | Single-Layer | 380 | — | — | Ag | 2.77 | 2.98 | 3.09 | 3.19 | 3.36 |

TABLE 2

| | Transparent Conductive Layer | Insulating Reflection Layer | | Metal Contact Layer | | Metal Reflection | Light Emission Output Po (mW) | | | | |
|---|---|---|---|---|---|---|---|---|---|---|---|
| | Thickness (nm) | Layer Structure | Thickness (nm) | Material | Thickness of Ni (nm) | Layer Material | Po 20 mA | Po 80 mA | Po 120 mA | Po 160 mA | Po 240 mA |
| Example 1 | 200 | Multi-Layer | 1218 | Ni | 2 | Al—Nd | 31.18 | 109.27 | 153.27 | 193.28 | 264.13 |
| Example 2 | 200 | Multi-Layer | 1218 | Ni/Al—Nd/Ta | 2 | Al—Nd | 31.14 | 109.28 | 153.48 | 193.72 | 264.09 |
| Comparative Example 1 | 200 | Multi-Layer | 1218 | Ni Entirely | 2 | Al—Nd | 28.98 | 101.95 | 143.59 | 181.41 | 249.00 |
| Comparative Example 2 | 200 | Single-Layer | 380 | — | — | Ag | 30.86 | 108.28 | 152.58 | 192.86 | 263.25 |

From the results shown in Table 1, it can be learned that the forward voltages (Vf: V) of the semiconductor light-emitting devices 1 of the flip-chip bonding type prepared in Examples 1 and 2 are substantially the same as that of the case where the metal contact layer 137 composed of Ni was formed on the entire surface of the insulating reflection layer 132 having the multilayer structure (Comparative Example 1) or that of the case where the conventional metal reflection layer composed of Ag was employed (Comparative Example 2).

In addition, it can be learned that, by further laminating the Al-containing layer (first metal layer) 138 and the second metal layer 139 containing Ta (tantalum) on the metal contact layer 137 formed inside the opening portion 132h (Example 2), oxidation of aluminum contained in the metal reflection layer 133 is further suppressed compared to the case where only the metal contact layer 137 was provided (Example 1), and therefore the forward voltage (Vf: V) is reduced.

in order to best explain the principles of the invention and its practical applications, thereby enabling others skilled in the art to understand the invention for various embodiments and with the various modifications as are suited to the particular use contemplated. It is intended that the scope of the invention be defined by the following claims and their equivalents.

The invention claimed is:

1. A semiconductor light-emitting element comprising:
   a laminated semiconductor layer in which an n-type semiconductor layer, a light-emitting layer and a p-type semiconductor layer are laminated;
   a transparent conductive layer that is laminated on the p-type semiconductor layer of the laminated semiconductor layer and is composed of a metal oxide having optical transparency to light emitted from the light-emitting layer;

an insulating reflection layer that is laminated on the transparent conductive layer, in which a plurality of opening portions are provided to expose part of the upper surface of the transparent conductive layer;

a metal reflection layer that is formed on the insulating reflection layer and inside the opening portions of the insulating reflection layer, the metal reflection layer containing aluminum or an aluminum-neodymium alloy; and a metal contact layer that is formed at least between the part of the upper surface of the transparent conductive layer exposed at the opening portion and part of the metal reflection layer formed inside the opening portion, and contains an element selected from Group VIA and Group VIII of a periodic table;

a first metal layer containing aluminum or an aluminum-neodymium alloy; and a second metal layer containing tantalum or nickel, wherein the first metal layer and the second metal layer are provided between the metal contact layer and the metal reflection layer.

2. The semiconductor light-emitting element according to claim 1, wherein the metal contact layer at least contains an element selected from chromium, molybdenum and nickel.

3. The semiconductor light-emitting element according to claim 2, wherein the insulating reflection layer is made of a multilayer insulating layer configured by alternately laminating a first insulating layer having a first refractive index and optical transparency to the light emitted from the light-emitting layer and a second insulating layer having a second refractive index, which is higher than the first refractive index, and optical transparency to the light emitted from the light-emitting layer.

4. The semiconductor light-emitting element according to claim 1, wherein the insulating reflection layer is made of a multilayer insulating layer configured by alternately laminating a first insulating layer having a first refractive index and optical transparency to the light emitted from the light-emitting layer and a second insulating layer having a second refractive index, which is higher than the first refractive index, and optical transparency to the light emitted from the light-emitting layer.

5. The semiconductor light-emitting element according to claim 1, wherein the insulating reflection layer is made of a multilayer insulating layer configured by alternately laminating a first insulating layer having a first refractive index and optical transparency to the light emitted from the light-emitting layer and a second insulating layer having a second refractive index, which is higher than the first refractive index, and optical transparency to the light emitted from the light-emitting layer.

* * * * *